US012801014B2

(12) United States Patent
Abe et al.

(10) Patent No.: US 12,801,014 B2

(45) Date of Patent: Nov. 17, 2026

(54) PHOTOSENSITIVE RESIN COMPOSITION, PHOTOSENSITIVE RESIN FILM, MULTILAYER PRINTED WIRING BOARD, SEMICONDUCTOR PACKAGE, AND PRODUCTION METHOD FOR MULTILAYER PRINTED WIRING BOARD

(71) Applicant: Showa Denko Materials Co., Ltd., Tokyo (JP)

(72) Inventors: Kohei Abe, Tokyo (JP); Mika Kimura, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 802 days.

(21) Appl. No.: 17/634,927

(22) PCT Filed: Aug. 14, 2019

(86) PCT No.: PCT/JP2019/031909

§ 371 (c)(1),
(2) Date: Feb. 11, 2022

(87) PCT Pub. No.: WO2021/029021

PCT Pub. Date: Feb. 18, 2021

(65) Prior Publication Data

US 2022/0276558 A1 Sep. 1, 2022

(51) Int. Cl.

| | |
|---|---|
| ***G03F 7/004*** | (2006.01) |
| ***G03F 7/027*** | (2006.01) |

(Continued)

(52) U.S. Cl.

CPC .......... *G03F 7/0382* (2013.01); *G03F 7/0045* (2013.01); *G03F 7/027* (2013.01);

(Continued)

(58) Field of Classification Search

CPC ... G03F 7/0045; G03F 7/032; H01L 21/4857; H01L 23/49822; H05K 3/429

See application file for complete search history.

(56) References Cited

U.S. PATENT DOCUMENTS

| | | | | |
|---|---|---|---|---|
| 2009/0104429 A1* | 4/2009 | Goto | ........................ | C08J 5/244 428/319.3 |
| 2011/0036625 A1* | 2/2011 | Narahashi | ............ | H05K 3/4661 427/97.1 |

(Continued)

FOREIGN PATENT DOCUMENTS

| | | |
|---|---|---|
| JP | 1995304931 A | 11/1995 |
| JP | 2017-097381 A | 6/2017 |

(Continued)

OTHER PUBLICATIONS

English translation of JP2019056940. (Year: 2019).*

(Continued)

*Primary Examiner* — Keith Walker
*Assistant Examiner* — Anna Malloy
(74) *Attorney, Agent, or Firm* — FITCH, EVEN, TABIN & FLANNERY, LLP

(57) ABSTRACT

A photosensitive resin composition contains: (A) a photopolymerizable compound having an ethylenically unsaturated group and an acidic substituent, (B) an epoxy resin, and (C) an active ester compound. A photosensitive resin film is formed of the photosensitive resin composition. A multilayer printed wiring board includes an interlayer insulator including a cured product of the photosensitive resin composition. A method for producing the multilayer printed wiring board includes a step of laminating the photosensitive resin film on one surface or both surfaces of a circuit substrate. A semiconductor package includes a semiconductor device mounted on the multilayer printed wiring board.

18 Claims, 1 Drawing Sheet

(51) Int. Cl.

| | |
|---|---|
| ***G03F 7/028*** | (2006.01) |
| ***G03F 7/032*** | (2006.01) |
| ***G03F 7/038*** | (2006.01) |
| ***H05K 3/46*** | (2006.01) |
| ***H10W 70/05*** | (2026.01) |
| ***H10W 70/65*** | (2026.01) |
| ***H10W 70/685*** | (2026.01) |
| *H05K 1/11* | (2006.01) |
| *H05K 3/42* | (2006.01) |

(52) U.S. Cl.
CPC .............. *G03F 7/028* (2013.01); *G03F 7/032* (2013.01); *H05K 3/4676* (2013.01); *H10W 70/05* (2026.01); *H10W 70/095* (2026.01); *H10W 70/65* (2026.01); *H10W 70/685* (2026.01); *H05K 1/115* (2013.01); *H05K 3/422* (2013.01); *H05K 3/429* (2013.01)

(56) References Cited

U.S. PATENT DOCUMENTS

| | | | | |
|---|---|---|---|---|
| 2013/0085208 | A1* | 4/2013 | Norikoshi | H05K 3/287 525/132 |
| 2014/0118964 | A1* | 5/2014 | Nakamura | H05K 3/465 361/748 |
| 2014/0154628 | A1* | 6/2014 | Nagoshi | C08G 59/186 430/280.1 |
| 2018/0327593 | A1* | 11/2018 | Kasahara | H05K 3/46 |
| 2019/0283373 | A1* | 9/2019 | Kasahara | H05K 1/03 |

FOREIGN PATENT DOCUMENTS

| | | | | | |
|---|---|---|---|---|---|
| JP | 2017116652 | A | * | 6/2017 | |
| JP | 2018021978 | A | * | 2/2018 | |
| JP | 2018058959 | A | * | 4/2018 | C08L 101/02 |
| JP | 2018087835 | A | | 6/2018 | |
| JP | 2019-66510 | A | | 4/2019 | |
| JP | 2019-66511 | A | | 4/2019 | |
| JP | 2019056940 | A | * | 4/2019 | C08F 290/00 |
| WO | WO-2016114030 | A1 | * | 7/2016 | C08F 36/06 |
| WO | WO-2018016534 | A1 | * | 1/2018 | H05K 3/4655 |

OTHER PUBLICATIONS

English translation of JP2017116652. (Year: 2017).*
English translation of JP2018021978. (Year: 2018).*
English translation of JP2018021978 Table 1. (Year: 2018).*
English translation of JP2018058959. (Year: 2018).*

* cited by examiner

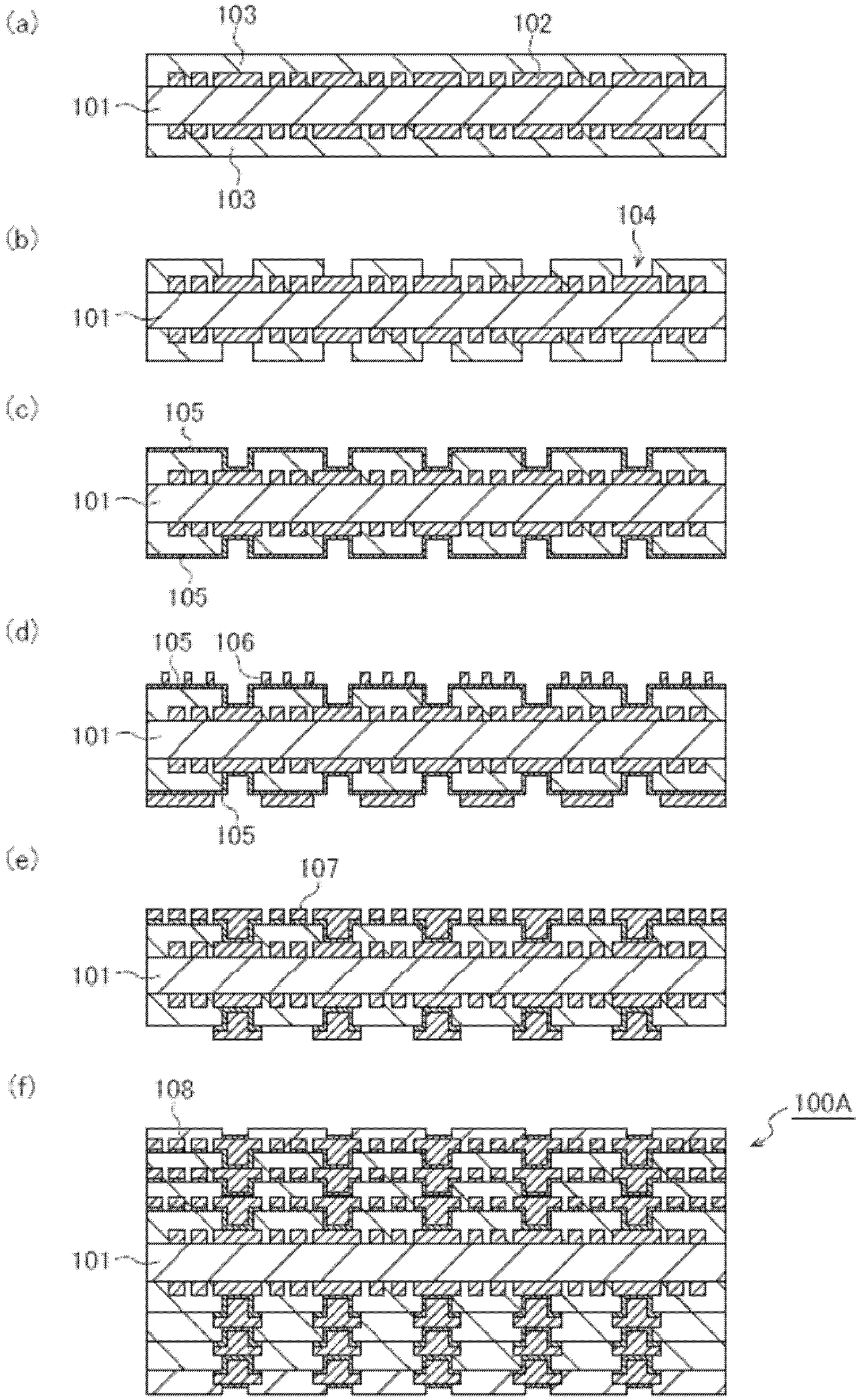
(a)
103
102
101
103
(b)
104
101
(c)
105
101
105
(d)
105
106
101
105
(e)
107
101
(f)
108
100A
101

PHOTOSENSITIVE RESIN COMPOSITION, PHOTOSENSITIVE RESIN FILM, MULTILAYER PRINTED WIRING BOARD, SEMICONDUCTOR PACKAGE, AND PRODUCTION METHOD FOR MULTILAYER PRINTED WIRING BOARD

CROSS-REFERENCE TO RELATED APPLICATIONS

This application is a U.S. national phase application filed under 35 U.S.C. § 371 of International Application No. PCT/JP2019/031909, filed Aug. 14, 2019, designating the United States, which is hereby incorporated herein by reference in its entirety.

TECHNICAL FIELD

The present invention relates to a photosensitive resin composition, a photosensitive resin film, a multilayer printed wiring board, a semiconductor package, and a method for producing a multilayer printed wiring board.

BACKGROUND ART

Recently, downsizing and performance enhancement of electronic devices have been progressing, and densification of a multilayer printed wiring board by increasing the number of circuit layers and miniaturization of wirings therein is progressing. In particular, densification of a semiconductor package substrate, such as BGA (ball grid array) and CSP (chip size package) on which semiconductor chips are mounted, is significant, and in addition to miniaturization of wirings, thinning of an insulating film and further reduction in the diameter of vias (also referred to as via holes) for interlayer connection are required.

As a conventional method of manufacturing a printed wiring board, there is known a method of manufacturing a multilayer printed wiring board by a build-up method (for example, see PTL 1) in which an interlayer insulator and a conductive circuit layer are sequentially laminated. For the multilayer printed wiring board, a semi-additive process in which a circuit is formed by plating has become the mainstream along with miniaturization of the circuit.

In a conventional semi-additive process, for example, (1) a thermosetting resin film is laminated on a conductor circuit, and the thermosetting resin film is cured by heating to form an "interlayer insulator". (2) Next, vias for interlayer connection are formed by laser machining, followed by desmear treatment and roughening treatment by alkali metal permanganate treatment. (3) Subsequently, the substrate is processed for electroless copper plating treatment and patterned using a resist, and thereafter processed for electrolytic copper plating treatment to form a copper circuit layer. (4) Next, the resist is peeled, and the electroless plating layer is flush-etched to form a copper circuit.

As described above, as a method for forming vias through an interlayer insulator formed by curing a thermosetting resin film, a laser processing method has been a mainstream, but diameter reduction of vias by laser irradiation using a laser processing machine has reached a limit. Further, for formation of vias using a laser processing machine, it is necessary to form each via hole one by one, and in the case where a large number of vias need to be formed by densification, much time is required to form the vias, and there is a problem in that the production efficiency is poor.

Given the situation, as a method capable of forming a large number of vias all at a time, there has been proposed a method of forming multiple small-diameter vias at a time by photolithography using a photosensitive resin composition containing an acid-modified vinyl group-containing epoxy resin, a photopolymerizable compound, a photopolymerization initiator, an inorganic filler and a silane compound in which the content of the inorganic filler is 10 to 80% by mass (for example, see PTL 2).

CITATION LIST

Patent Literature

PTL 1: JP 1995-304931 A
PTL 2: JP 2017-116652 A

SUMMARY OF INVENTION

Technical Problem

In PTL 2, one technical problem is to suppress reduction in adhesiveness of the plating copper to be caused by using a photosensitive resin composition in place of a conventional thermosetting resin composition as materials for an interlayer insulator and a surface protective layer, and other problems are resolution of vias and adhesiveness between a silicone material substrate and chip members, and these problems are said to be solved.

In recent years, the substrate material is required to be applicable to a fifth generation mobile communication system (5G) antenna in which radio waves in a frequency band exceeding 6 GHz are used and to a millimeter wave radar in which radio waves in a frequency band of 30 to 300 GHz are used. For this purpose, it is necessary to develop a resin composition having further improved dielectric characteristics in a 10 GHz band or more. However, in the technique of PTL 2, it is difficult to achieve further improvement in dielectric characteristics while maintaining other good characteristics.

Accordingly, an object of the present invention is to provide a photosensitive resin composition having excellent dielectric characteristics and a method for producing it, a photosensitive resin film using the photosensitive resin composition, a multilayer printed wiring board and a method for producing it, and a semiconductor package.

Solution to Problem

To solve the above-mentioned problems, the present inventors have made assiduous studies and, as a result, have found that the problems can be solved by the present invention described below, and have completed the present invention.

Specifically, the present invention relates to the following [1] to [16].

[1] A photosensitive resin composition containing:

(A) a photopolymerizable compound having an ethylenically unsaturated group and an acidic substituent, (B) an epoxy resin, and (C) an active ester compound.

[2] The photosensitive resin composition according to the above [1], wherein the (A) photopolymerizable compound having an ethylenically unsaturated group and an acidic substituent contains an alicyclic structure represented by the following general formula (A-1):

(A-1)

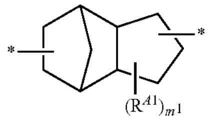

wherein $R^{A1}$ represents an alkyl group having 1 to 12 carbon atoms, and may be at any position in the alicyclic structure, $m^1$ represents an integer of 0 to 6, and * is a bonding position to the other structure.

[3] The photosensitive resin composition according to the above [1] or [2], wherein the acid value of the (A) photopolymerizable compound having an ethylenically unsaturated group and an acidic substituent is 20 to 200 mgKOH/g.

[4] The photosensitive resin composition according to any of the above [1] to [3], containing a bisphenol-type epoxy resin and an aralkyl-type epoxy resin as the (B) epoxy resin.

[5] The photosensitive resin composition according to any of the above [1] to [4], wherein the (C) active ester compound is a compound having two or more active ester groups in one molecule, and the two or more active ester groups are active ester groups formed from a polycarboxylic acid compound and a phenolic hydroxy group-having compound.

[6] The photosensitive resin composition according to any of the above [1] to [5], wherein the equivalent ratio of the epoxy group of the (B) epoxy resin to the acidic substituent of the (A) photopolymerizable compound having an ethylenically unsaturated group and an acidic substituent [epoxy group/acidic substituent] is 0.5 to 6.0, and the equivalent ratio of the active ester group of the (C) active ester compound to the epoxy group of the (B) epoxy resin [active ester group/epoxy group] is 0.01 to 0.4.

[7] The photosensitive resin composition according to any of the above [1] to [6], further containing (D) a crosslinking agent having two or more ethylenically unsaturated groups and not having an acidic substituent.

[8] The photosensitive resin composition according to any of the above [1] to [7], further containing (E) an elastomer, and containing, as the (E) elastomer, an elastomer having an ethylenically unsaturated group and an acidic substituent.

[9] The photosensitive resin composition according to any of the above [1] to [8], further containing (F) a photopolymerization initiator.

[10] The photosensitive resin composition according to any of the above [1] to [9], further containing (G) an inorganic filler in an amount of 10 to 80% by mass based on the total solid content of the photosensitive resin composition.

[11] The photosensitive resin composition according to any of the above [1] to [10], further containing (H) a curing accelerator.

[12] The photosensitive resin composition according to any of the above [1] to [11], which is used for formation of one or more selected from the group consisting of a photovia and an interlayer insulator.

[13] A photosensitive resin film formed of the photosensitive resin composition of any of the above [1] to [12].

[14] A multilayer printed wiring board containing an interlayer insulator formed using the photosensitive resin composition of any of the above [1] to [12] or the photosensitive resin film of the above [13].

[15] A semiconductor package wherein a semiconductor device is mounted on the multilayer printed wiring board of the above [14].

[16] A method for producing a multilayer printed wiring board including the following steps (1) to (4):

Step (1): a step of laminating the photosensitive resin film of the above [13] on one surface or both surfaces of a circuit substrate;

Step (2): a step of exposing and developing the photosensitive resin film laminated in the above step (1) to form an interlayer insulator having vias;

Step (3): a step of roughening the vias and the interlayer insulator; and

Step (4): a step of forming a circuit pattern on the interlayer insulator.

Advantageous Effects of Invention

According to the present invention, there can be provided a photosensitive resin composition having excellent dielectric characteristics and a method for producing it, a photosensitive resin film using the photosensitive resin composition, a multilayer printed wiring board and a method for producing it, and a semiconductor package.

BRIEF DESCRIPTION OF DRAWING

FIG. 1 is a schematic view showing one embodiment of a production step of producing a multilayer printed wiring board using a cured product of a photosensitive resin composition of the present embodiment as at least one of a surface protective film and an interlayer insulator.

DESCRIPTION OF EMBODIMENT

Of the numerical range described in the present specification, the upper limit and the lower limit can be replaced with the values shown in Examples. Further, in the present specification, regarding the content of each component in the photosensitive resin composition, in the case where plural kinds of substances corresponding to the component exist, the content means, unless otherwise specifically indicated, a total content of the plural kinds of substances existing in photosensitive resin composition.

Also, embodiments in which the descriptions in the present specification are combined arbitrarily are contained in the present invention.

In the present specification, "a resin component" means a total amount of the components not containing an inorganic filler and a diluent that can be optionally contained therein, as described hereinunder.

Also in the present specification, "a solid content" means a nonvolatile content excluding volatile substances such as water and solvent contained in the photosensitive resin composition, and shows a component that remains therein without being evaporated in drying the resin composition, and includes those that are liquid, water-syrup or waxy at room temperature of around 25 °C.

In the present specification, "(meth)acrylate" means "acrylate or methacrylate", and the same applies to the other similar terms.

[Photosensitive Resin Composition]

The photosensitive resin composition of one embodiment of the present invention (hereinunder this may be simply referred to as the present embodiment) is a photosensitive resin composition containing:

(A) a photopolymerizable compound having an ethylenically unsaturated group and an acidic substituent, (B) an epoxy resin, and (C) an active ester compound.

In the present specification, the above components may be abbreviated as the component (A), the component (B) and the component (C), and the same type of abbreviation may apply to the other components.

The photosensitive resin composition of the present embodiment is excellent in dielectric characteristics and is suitable to photolithography for via formation (this may be referred to as photo-via formation), and is therefore favorable for formation of one or more selected from the group consisting of photo-vias and interlayer insulators. Accordingly, the present invention also provides a photosensitive resin composition for photo-via formation that contains the photosensitive resin composition of the present embodiment, and a photosensitive resin composition for interlayer insulator that contains the photosensitive resin composition of the present embodiment.

The photosensitive resin composition of the present embodiment is suitable to a negative photosensitive resin composition.

Hereinunder the components that the photosensitive resin composition can contain are described in detail.

<(A) Photopolymerizable Compound Having an Ethylenically Unsaturated Group and an Acidic Substituent>

The photosensitive resin composition of the present embodiment contains a photopolymerizable compound having an ethylenically unsaturated group and an acidic substituent as the component (A).

As the component (A), one alone or two or more kinds can be used either singly or as combined.

The component (A) is a compound that expresses photopolymerizability as having an ethylenically unsaturated group.

Examples of the ethylenically unsaturated group that the component (A) has include photopolymerizable functional groups such as a vinyl group, an allyl group, a propargyl group, a butenyl group, an ethynyl group, a phenylethynyl group, a maleimide group, a nadimide group, and a (meth) acryloyl group. Among these, a (meth)acryloyl group is preferred from the viewpoint of reactivity and via resolution.

The component (A) has an acidic substituent from the viewpoint of enabling alkali development.

Examples of the acidic substituent that the component (A) has include a carboxy group, a sulfonic acid group, and a phenolic hydroxy group. Among these, a carboxy group is preferred from the viewpoint of via resolution.

The acid value of the component (A) is preferably 20 to 200 mgKOH/g, more preferably 40 to 180 mgKOH/g, even more preferably 70 to 150 mgKOH/g, especially more preferably 90 to 120 mgKOH/g. When the acid value of the component (A) is not less than the above lower limit, the solubility of the photosensitive resin composition in a dilute alkali solution tends to be excellent, and when it is not more than the above upper limit, the dielectric characteristics of the cured product of the composition tend to be excellent. The acid value of the component (A) can be measured according to the method described in the section of Examples.

Two or more kinds of the component (A) each having a different acid value can be used as combined, and in the case of the combined use, the weight-average acid value of the two or more kinds of the component (A) preferably falls within any of the above range.

The weight-average molecular weight (Mw) of the component (A) is preferably 600 to 30,000, more preferably 800 to 25,000, even more preferably 1,000 to 18,000. When the weight-average molecular weight (Mw) of the component (A) falls within the above range, adhesiveness to plating copper, heat resistance and insulation reliability tend to be excellent. Here, in the present specification, the weight-average molecular weight is a value measured according to the following method.

<Method for Measurement of Weight-Average Molecular Weight>

The weight-average molecular weight is a value measured using the GPC measurement device and the measurement condition mentioned below, and converted using a standard polystyrene calibration curve. For formation of the calibration curve, 5 sample sets ("PStQuick MP-H" and "PStQuick B", by Tosoh Corporation) were used as the standard polystyrene.

(GPC Measurement Device)

GPC device: high-speed GPC device "HCL-8320GPC", with a detector of a differential refractometer or UV, by Tosoh Corporation.

Column: column TSKgel SuperMultipore HZ-H (column length: 15 cm, column inner diameter: 4.6 mm), by Tosoh Corporation (Measurement Condition)

Solvent: tetrahydrofuran (THF)

Measurement temperature: 40 °C

Flow rate: 10 mg/THF 5 ml

Injection amount: 20 μl

From the viewpoint of dielectric characteristics, the component (A) preferably contains an alicyclic skeleton.

The alicyclic skeleton that the component (A) has is, from the viewpoint of via resolution, adhesion strength to plating copper and electric insulation reliability, an alicyclic skeleton having a ring carbon number of 5 to 20, more preferably an alicyclic skeleton having a ring carbon number of 5 to 18, even more preferably an alicyclic skeleton having a ring carbon number of 6 to 18, further more preferably an alicyclic skeleton having a ring carbon number of 8 to 14, and most preferably an alicyclic skeleton having a ring carbon number of 8 to 12.

Preferably, from the viewpoint of via resolution, adhesion strength to plating copper and electric insulation reliability, the alicyclic skeleton is composed of 2 or more rings, more preferably 2 to 4 rings, even more preferably 3 rings. Examples of the alicyclic skeleton of 2 or more rings include a norbornane skeleton, a decalin skeleton, a bicycloundecane skeleton, and a dicyclopentadiene skeleton. Among these, from the viewpoint of via resolution, adhesion strength to plating copper and electric insulation reliability, a dicyclopentadiene skeleton is preferred.

From the same viewpoint, the component (A) is preferably one containing an alicyclic structure represented by the following general formula (A-1).

(A-1)

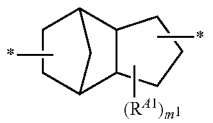

wherein $R^{A1}$ represents an alkyl group having 1 to 12 carbon atoms, and may be at any position in the alicyclic structure, $m^1$ represents an integer of 0 to 6, and * indicates a bonding position to the other structure.

In the general formula (A-1), examples of the alkyl group having 1 to 12 carbon atoms represented by $R^{A1}$ include a methyl group, an ethyl group, an n-propyl group, an isopropyl group, an n-butyl group, an isobutyl group, a t-butyl group, and an n-pentyl group. The alkyl group is preferably an alkyl group having 1 to 6 carbon atoms, more preferably an alkyl group having 1 to 3 carbon atoms, and even more preferably a methyl group.

$m^1$ represents an integer of 0 to 6, and is preferably an integer of 0 to 2, more preferably 0.

In the case where $m^1$ is an integer of 2 to 6, plural $R^{A1}$'s may be the same as or different from each other. Further, the plural $R^{A1}$'s may bond to the same carbon atom within a possible range, or may bond to different carbon atoms.

* is a bonding position to the other structure, which may bond to any carbon atom on the alicyclic skeleton but preferably bonds to the carbon atom shown by 1 or 2 in the following general formula (A-1') and to the carbon atom shown by any of 3 or 4.

(A-1')

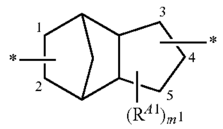

wherein $R^{A1}$, $m^1$ and * are the same as those in the general formula (A-1).

The component (A) is, from the viewpoint of via resolution and adhesiveness to plating copper, preferably an acid-modified vinyl group-containing epoxy resin produced by reacting a compound prepared by modifying (a1) an epoxy resin with (a2) an ethylenically unsaturated group-containing organic acid [hereinafter this may be referred to as a component (A')], with (a3) a saturated group or unsaturated group-containing polybasic acid anhydride. Here, "acid modification" for the acid-modified vinyl group-containing epoxy resin means that the resultant resin has an acidic substituent, and "vinyl group" means an ethylenically unsaturated group, "epoxy resin" means that an epoxy resin is used as a raw material, and the acid-modified vinyl group-containing epoxy resin does not necessarily have to have an epoxy group, and may not have an epoxy group.

Hereinunder preferred embodiment of the component (A) produced from (a1) an epoxy resin, (a2) an ethylenically unsaturated group-containing organic acid, and (a3) a saturated group or unsaturated group-containing polybasic acid anhydride.

((a1) Epoxy Resin)

The epoxy resin (a1) is preferably an epoxy resin having 2 or more epoxy groups.

One alone or two or more kinds of epoxy resins (a1) can be used either singly or as combined.

The epoxy resin (a1) is classified into a glycidyl ether-type epoxy resin, a glycidylamine-type epoxy resin, a glycidyl ester-type epoxy resin. Among these, a glycidyl ether-type epoxy resin is preferred.

The epoxy resin (a1) can be classified into various epoxy resins depending on the difference in the main skeleton, and for example, can be classified into an alicyclic skeleton-having epoxy resin, a novolak-type epoxy resin, a bisphenol-type epoxy resin, an aralkyl-type epoxy resin, and other epoxy resins. Among these, an alicyclic skeleton-having epoxy resin and a novolak-type epoxy resin are preferred.

—Alicyclic Skeleton-Having Epoxy Resin—

The alicyclic skeleton of the epoxy resin having an alicyclic skeleton is described in the same manner as the alicyclic skeleton of the component (A) described above, and preferred embodiments thereof are also the same.

The alicyclic skeleton-having epoxy resin is preferably an epoxy resin represented by the following general formula (A-2).

(A-2)

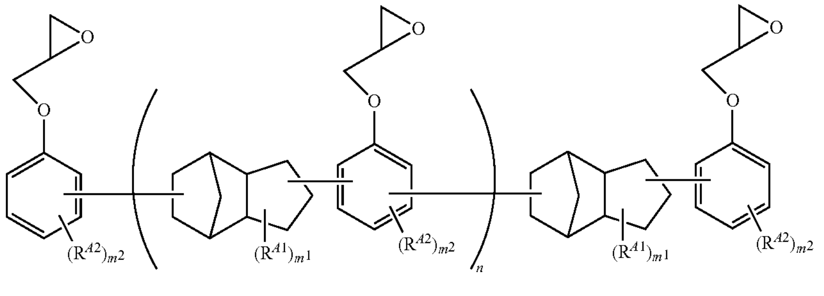

wherein $R^{A1}$ represents an alkyl group having 1 to 12 carbon atoms, and may be at any position in the alicyclic skeleton, $R^{A2}$ represents an alkyl group having 1 to 12 carbon atoms, $m^1$ represents an integer of 0 to 6, $m^2$ represents an integer of 0 to 3, and n represents a number of 0 to 50.

In the general formula (A-2), $R^{A1}$ is the same as $R^{A1}$ in the general formula (A-1), and preferred embodiments thereof are also the same.

Examples of the alkyl group having 1 to 12 carbon atoms that $R^{A2}$ in the general formula (A-2) represents includes a methyl group, an ethyl group, an n-propyl group, an isopropyl group, an n-butyl group, an isobutyl group, a t-butyl group, and an n-pentyl group. The alkyl group is preferably an alkyl group having 1 to 6 carbon atoms, more preferably an alkyl group having 1 to 3 carbon atoms, even more preferably a methyl group.

$m^1$ in the general formula (A-2) is the same as $m^1$ in the general formula (A-1), and preferred embodiments thereof are also the same.

$m^2$ in the general formula (A-2) represents an integer of 0 to 3, and is preferably 0 or 1, more preferably 0.

n in the general formula (A-2) represents the number of repetitions of the structural unit in the parenthesis, and is a number of 0 to 50. In general, an epoxy resin is in the form of a mixture of those having a different number of repetitions of the structural unit in the parenthesis, and therefore in such a case, n is represented by an average value of the mixture. n is preferably a number of 0 to 30.

As the alicyclic skeleton-having epoxy resin, commercial products can be used, and examples of the commercial products include XD-1000 (trade name, by Nippon Kayaku Co., Ltd.), and EPICLON (registered trademark) HP-7200 (trade name, by DIC Corporation).

—Novolak-Type Epoxy Resin—

Examples of the novolak-type epoxy resin include a bisphenol novolak-type epoxy resin such as a bisphenol A novolak-type epoxy resin, a bisphenol F novolak-type epoxy resin, and a bisphenol S novolak-type epoxy resin; and a phenol novolak-type epoxy resin, a cresol novolak-type epoxy resin, a biphenyl novolak-type epoxy resin, and a naphthol novolak-type epoxy resin.

The novolak-type epoxy resin is preferably an epoxy resin having a structural unit represented by the following general formula (A-3).

(A-3)

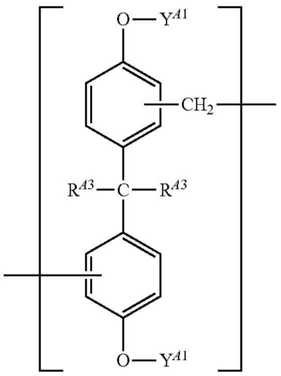

wherein $R^{A3}$ represents a hydrogen atom or a methyl group. $Y^{A1}$ each independently represents a hydrogen atom or a glycidyl group, two $R^{A3}$'s may be the same as or different from each other, and at least one of two $Y^{A1}$'s is a glycidyl group.

From the viewpoint of via resolution and adhesiveness to plating copper, both $R^{A3}$'s are preferably hydrogen atoms. Also from the same viewpoint, both $Y^{A1}$'s are preferably glycidyl groups.

In the epoxy resin (a1) having a structural unit represented by the general formula (A-3), the number of the structural units is 1 or more, and is preferably a number of 10 to 100, more preferably a number of 15 to 80, even more preferably a number of 15 to 70. When the number of the structural units falls within the above range, adhesion strength, heat resistance and insulation reliability tend to improve.

Those where both $R^{A3}$'s are hydrogen atoms and both $Y^{A1}$'s are glycidyl groups in the general formula (A-3) are commercially available as EXA-7376 Series (trade name by DIC Corporation), and those where both $R^{A3}$'s are methyl groups and both $Y^{A1}$'s are glycidyl groups are as EPON SU8 Series (trade name by Mitsubishi Chemical Corporation).

Examples of the bisphenol-type epoxy resin include a bisphenol A-type epoxy resin, a bisphenol F-type epoxy resin, a bisphenol S-type epoxy resin, and 3,3',5,5'-tetramethyl-4,4'-diglycidyloxydiphenylmethane.

Examples of the aralkyl-type epoxy resin include a phenol aralkyl-type epoxy resin, a biphenyl aralkyl-type epoxy resin, and a naphthol aralkyl-type epoxy resin.

Examples of the other epoxy resins include a stilbene-type epoxy resin, a naphthalene-type epoxy resin, a naphthylene ether-type epoxy resin, a biphenyl-type epoxy resin, a dihydroanthracene-type epoxy resin, a cyclohexanedimethanol-type epoxy resin, a trimethylol-type epoxy resin, an alicyclic epoxy resin, an aliphatic linear epoxy resin, a heterocyclic epoxy resin, a spiro ring-containing epoxy resin, and a rubber-modified epoxy resin.

((a2) Ethylenically Unsaturated Group-Containing Organic Acid)

The ethylenically unsaturated group-containing organic acid (a2) is preferably an ethylenically unsaturated group-containing monocarboxylic acid.

The ethylenically unsaturated group that the component (a2) has includes the same as those described hereinabove as the ethylenically unsaturated group that the component (A) has.

Examples of the component (a2) include acrylic acid, an acrylic acid derivative such as a dimer of acrylic acid, and methacrylic acid, ß-furfurylacrylic acid, ß-styrylacrylic acid, cinnamic acid, crotonic acid, and a-cyanocinnamic acid; a half-ester compound which is a reaction product of a hydroxy group-containing acrylate and a dibasic acid anhydride; and a half-ester compound which is a reaction product of a vinyl group-containing monoglycidyl ether or a vinyl group-containing monoglycidyl ester and a dibasic acid anhydride.

As the component (a2), one kind alone or two or more kinds can be used either singly or as combined.

The half-ester compound can be produced, for example, by reacting at least one ethylenically unsaturated group-containing compound selected from the group consisting of a hydroxy group-containing acrylate, a vinyl group-containing monoglycidyl ether and a vinyl group-containing monoglycidyl ester with a dibasic acid anhydride. Regarding the reaction, preferably, an ethylenically unsaturated group-containing compound and a dibasic acid anhydride are reacted in equimolar amounts.

Examples of the hydroxy group-containing acrylate for use in synthesis of the half-ester compound include hydroxyethyl (meth)acrylate, hydroxypropyl (meth) acrylate, hydroxybutyl (meth)acrylate, polyethylene glycol mono(meth) acrylate, trimethylolpropane di(meth)acrylate, pentaerythritol tri(meth)acrylate, and dipentaerythritol penta (meth)acrylate.

Examples of the vinyl group-containing monoglycidyl ether include glycidyl (meth)acrylate.

The dibasic acid anhydride for use in synthesis of the half-ester compound may be one having a saturated group, or may be one having an unsaturated group. Examples of the dibasic acid anhydride include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, and itaconic anhydride.

In reaction of the component (a1) and the component (a2), the amount to be used of the component (a2) is preferably 0.6 to 1.05 equivalents relative to one equivalent of the epoxy group of the component (a1), more preferably 0.7 to 1.02 equivalents, even more preferably 0.8 to 1.0 equivalent. When the component (a1) and the component (a2) are reacted in the above ratio, the photopolymerizability of the component (A) may improve and the via resolution of the resultant photosensitive resin composition thereby tends to improve.

Preferably, the component (a1) and the component (a2) are dissolved in an organic solvent and reacted.

Examples of the organic solvent include ketones such as methyl ethyl ketone, and cyclohexanone; aromatic hydrocarbons such as toluene, xylene, and tetramethylbenzene; glycol ethers such as methylcellosolve, butylcellosolve, methylcarbitol, butylcarbitol, propylene glycol monomethyl ether, dipropylene glycol monoethyl ether, dipropylene glycol diethyl ether, and triethylene glycol monoethyl ether; esters such as ethyl acetate, butyl acetate, butylcellosolve acetate, and carbitol acetate; aliphatic hydrocarbons such as octane, and decane; and petroleum solvents such as petroleum ether, petroleum naphtha, hydrogenated petroleum naphtha, and sorbent naphtha. One alone or two or more kinds of organic solvents can be used either singly or as combined.

In reaction of the component (a1) and the component (a2), preferably, a catalyst for promoting the reaction is used. Examples of the catalyst include amine catalysts such as triethylamine, and benzylmethylamine; quaternay ammonium salt catalysts such as methyltriethylammonium chloride, benzyltrimethylammonium chloride, benzyltrimethylammonium bromide, and benzyltrimethylammonium iodide; and phosphine catalysts such as triphenyl phosphine. Among these, phosphine catalysts are preferred, and triphenyl phosphine is more preferred. One alone or two or more kinds of catalysts can be used either singly or as combined.

In the case where a catalyst is used, the amount thereof to be used is, from the viewpoint of attaining a suitable reaction speed, preferably 0.01 to 10 parts by mass relative to 100 parts by mass of the total of the component (a1) and the component (a2), more preferably 0.05 to 5 parts by mass, even more preferably 0.1 to 2 parts by mass.

In reaction of the component (a1) and the component (a2), preferably a polymerization inhibitor is used for the purpose of inhibiting polymerization during the reaction. Examples of the polymerization inhibitor include hydroquinone, methylhydroquinone, hydroquinone monomethyl ether, catechol, and pyrogallol. One alone or two or more kinds of polymerization inhibitors can be used either singly or as combined.

In the case where a polymerization inhibitor is used, the amount thereof to be used is preferably 0.01 to 1 part by mass relative to 100 parts by mass of the total of the component (a1) and the component (a2), more preferably 0.02 to 0.8 parts by mass, even more preferably 0.1 to 0.5 parts by mass.

The reaction temperature between the component (a1) and the component (a2) is, from the viewpoint of attaining homogeneous reaction while securing sufficient reactivity, preferably 60 to 150 °C, more preferably 80 to 120 °C, even more preferably 90 to 110 °C.

In that manner where an ethylenically unsaturated group-containing monocarboxylic acid is used as the component (a2) for the component (A') to be produced by reacting the component (a1) and the component (a2), the component (A') has a hydroxy group formed by ring-opening addition reaction between the epoxy group in the component (a1) and the carboxy group in the component (a2). Next, the component (A') is further reacted with a component (a3) to half-esterify the hydroxy group in the component (A') (including the hydroxy group originally existing in the component (a1)) with the acid anhydride group in the component ($_a$3) to thereby give an acid modified vinyl group-containing epoxy resin.

((a3) Polybasic Acid Anhydride)

The component (a3) may contain a saturated group, or may contain an unsaturated group. Examples of the component (a3) include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, and itaconic anhydride. Among these, from the viewpoint of via resolution, tetrahydrophthalic anhydride is preferred. One alone or two or more kinds can be used for the component (a3) either singly or as combined.

In reaction of the component (A') and the component (a3), the acid value of the acid-modified vinyl group-containing epoxy resin can be controlled, for example, by reacting the component (a3) in an amount of 0.1 to 1.0 equivalent relative to one equivalent of the hydroxy group in the component (A').

The reaction temperature between the component (A') and the component (a3) is, from the viewpoint of attaining homogeneous reaction while securing sufficient reactivity, preferably 50 to 150 °C, more preferably 60 to 120 °C, even more preferably 70 to 100 °C.

The content of the component (A) in the photosensitive resin composition of the present embodiment is, though not specifically limited but from the viewpoint of heat resistance, dielectric characteristics and chemical resistance, preferably 10 to 80% by mass based on the total amount of the resin component in the photosensitive resin composition, more preferably 20 to 60% by mass, even more preferably 30 to 50% by mass.

<(B) Epoxy Resin>

The photosensitive resin composition of the present embodiment contains an epoxy resin as the component (B).

Containing an epoxy resin (B), the photosensitive resin composition of the present embodiment secures excellent heat resistance in addition to adhesiveness to plating copper and insulation reliability.

One alone or two or more kinds can be used as the epoxy resin (B) either singly or as combined.

The epoxy resin (B) is preferably an epoxy resin having two or more epoxy groups. The epoxy resin is classified into a glycidyl ether-type epoxy resin, a glycidylamine-type epoxy resin, and a glycidyl ester-type epoxy resin. Among these, an glycidyl ether-type epoxy resin is preferred.

The epoxy resin (B) can also be classified into various epoxy resins depending on the difference in the main skeleton, and for example, can be classified into a bisphenol-type epoxy resin, a novolak-type epoxy resin, an aralkyl-type epoxy resin, an alicyclic skeleton-having epoxy resin, and other epoxy resins.

Examples of the bisphenol-type epoxy resin include a bisphenol A-type epoxy resin, a bisphenol F-type epoxy resin, a bisphenol S-type epoxy resin, and 3,3',5, 5'-tetramethyl-4,4'-diglycidyloxydiphenylmethane.

Examples of the novolak-type epoxy resin include a bisphenol novolak-type epoxy resin such as a bisphenol A novolak-type epoxy resin, a bisphenol F novolak-type epoxy resin, and a bisphenol S novolak-type epoxy resin; and a phenol novolak-type epoxy resin, a cresol novolak-type epoxy resin, a biphenyl novolak-type epoxy resin, and a naphthol novolak-type epoxy resin.

Examples of the aralkyl-type epoxy resin include a phenol aralkyl-type epoxy resin, a biphenyl aralkyl-type epoxy resin, and a naphthol aralkyl-type epoxy resin.

Examples of the alicyclic skeleton-having epoxy resin include a dicyclopentadienyl-type epoxy resin.

Examples of the other epoxy resins include a stilbene-type epoxy resin, a naphthalene-type epoxy resin, a naphthylene ether-type epoxy resin, a biphenyl-type epoxy resin, a dihydroanthracene-type epoxy resin, a cyclohexanedimethanol-type epoxy resin, a trimethylol-type epoxy resin, an alicyclic epoxy resin, an aliphatic linear epoxy resin, a heterocyclic epoxy resin, a spiro ring-containing epoxy resin, and a rubber-modified epoxy resin.

Among these, as the epoxy resin (B), from the viewpoint of insulation reliability, dielectric characteristics, heat resistance and adhesiveness to plating copper, preferred are a bisphenol-type epoxy resin, a novolak-type epoxy resin and an aralkyl-type epoxy resin, and more preferred are 3,3',5,5'-tetramethyl-4,4'-diglycidyloxydiphenylmethane, a naphthol novolak-type epoxy resin, and a biphenyl aralkyl-type epoxy resin.

As the epoxy resin (B), from the viewpoint of insulation reliability, dielectric characteristics, heat resistance and adhesiveness to plating copper, a combined use of a bisphenol-type epoxy resin and a novolak-type epoxy resin or an aralkyl-type epoxy resin is preferred, and more preferred is a combination of a bisphenol-type epoxy resin and an aralkyl-type epoxy resin, even more preferred is a combination of 3,3',5,5'-tetramethyl-4,4'-diglycidyloxydiphenylmethane and a biphenyl aralkyl-type epoxy resin.

In the case where a combination of a bisphenol-type epoxy resin and a novolak-type epoxy resin or an aralkyl-type epoxy resin is used as the epoxy resin (B), the content ratio of the two [bisphenol-type epoxy resin/novolak-type epoxy resin or aralkyl-type epoxy resin] is, though not specifically limited, preferably 1.0 to 4.0, more preferably 1.5 to 3.0, even more preferably 2.0 to 2.5.

The equivalent ratio of the epoxy group in the component (B) in the photosensitive resin composition of the present embodiment to the acidic substituent in the component (A) therein [epoxy group/acidic substituent] is, though not specifically limited but from the viewpoint of insulation reliability, dielectric characteristics, heat resistance and adhesiveness to plating copper, preferably 0.5 to 6.0, more preferably 0.7 to 4.0, even more preferably 0.8 to 2.0, especially more preferably 0.9 to 1.2.

The content of the component (B) in the photosensitive resin composition of the present embodiment is, though not specifically limited but from the viewpoint of insulation reliability, dielectric characteristics, heat resistance and adhesiveness to plating copper, preferably 1 to 50% by mass based on the total amount of the resin component in the photosensitive resin composition, more preferably 5 to 30% by mass, even more preferably 10 to 20% by mass.

<(C) Active Ester Compound>

The photosensitive resin composition of the present embodiment contains an active ester compound as the component (C).

Containing an active ester compound (C), the photosensitive resin composition of the present embodiment can have a low dielectric loss tangent while maintaining other good characteristics.

Examples of the active ester compound (C) include those having a highly-active ester group, such as a phenol ester compound, a thiophenol ester compound, an N-hydroxyamine ester compound, and an esterified compound of a heterocyclic hydroxy compound. These active ester compounds (C) can be linear or can also be multi-branched.

The active ester compound (C) is preferably a compound having two or more ester groups in one molecule.

One alone or two or more kinds can be used either singly or as combined as the active ester compound (C).

The active ester compound (C) is a compound having two or more active ester groups in one molecule, and preferably, those two or more active ester groups are active ester groups formed from (c1) a polycarboxylic acid compound and (c2) a phenolic hydroxy group-having compound.

The active ester group formed from (c1) a polycarboxylic acid compound and (c2) a phenolic hydroxy group-having compound is an ester bond that is formed by esterification reaction (condensation reaction) between the carboxy group that the polycarboxylic acid compound (c1) has and the phenolic hydroxy group that the phenolic hydroxy group-having compound (c2) has.

Examples of the polycarboxylic acid compound (c1) include a compound having two or more aliphatic carboxy groups, and a compound having two or more aromatic carboxy groups.

Examples of the compound having two or more aliphatic carboxy groups include succinic acid, maleic acid and itaconic acid.

Examples of the compound having two or more aromatic carboxy groups include benzene-dicarboxylic acids such as phthalic acid, isophthalic acid, and terephthalic acid; benzene-tricarboxylic acids such as trimesic acid; and benzene-tetracarboxylic acids such as pyromellitic acid.

Among these, from the viewpoint of heat resistance and dielectric characteristics, preferred is a compound having two or more aromatic carboxy groups, and more preferred is a benzene-dicarboxylic acid.

One alone or two or more kinds can be used as the polycarboxylic acid compound (c1).

Examples of the phenolic hydroxy group-having compound (c2) include a compound having one, two or three or more phenolic hydroxy groups.

Examples of the compound having one phenolic hydroxy group include monophenols such as phenol, o-cresol, m-cresol and p-cresol; mononaphthols such as a-naphthol and ß-naphthol; and hydroxybenzophenone.

Examples of the compound having two phenolic hydroxy groups include dihydroxybenzenes such as hydroquinone, resorcinol, and catechol; bisphenols such as bisphenol A, bisphenol F, bisphenol S, methylated bisphenol A, methylated bisphenol F, and methylated bisphenol S; dihydroxynaphthalenes such as 1,5-dihydroxynaphthalene, 1,6-dihydroxynaphthalene, and 2,6-dihydroxynaphthalene; phenolphthalin, and dicyclopentadiene-type phenol resins having two phenolic hydroxy groups.

Examples of the compound having three or more phenolic hydroxy groups include trihydroxybenzophenone, benzenetriol, tetrahydroxybenzopyhenone, phenol-novolak resins, and phenol-aralkyl resins.

Among these, from the viewpoint of heat resistance and dielectric characteristics, preferred are a compound having one phenolic hydroxy group and a compound having two phenolic hydroxy groups, preferred are monophenols, mononaphthols, bisphenols, dicyclopentadiene-type phenolic resins having two phenolic hydroxy groups.

One alone or two or more kinds can be used as the phenolic hydroxy group-having compound (c2) either singly or as combined.

The monophenols can also be those represented by the following general formula (C-1); the mononaphthols can also be those represented by the following general formula (C-2), the bisphenols can also be those represented by the following general formula (C-3), and the dicyclopentadiene-type phenolic resins having two phenolic hydroxy groups can also be those represented by the following general formula (C-4).

(C-1)

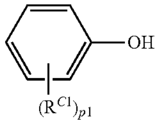

(C-2)

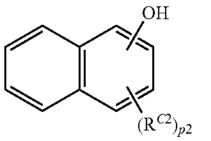

(C-3)

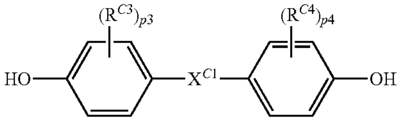

(C-4)

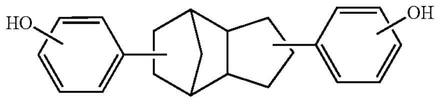

In these formulae, $R^{C1}$ to $R^{C4}$ each independently represent a monovalent organic group, $X^{C1}$ represents a divalent organic group, p1 represents an integer of 0 to 5, p2 represents an integer of 0 to 7, and p3 and p4 each independently represent an integer of 0 to 4.

Examples of the monovalent organic group that $R^{C1}$ to $R^{C4}$ in the above general formulae (C-1) to (C-4) represent include a monovalent aliphatic hydrocarbon group such as an alkyl group having 1 to 10 carbon atoms, an alkenyl group having 2 to 10 carbon atoms, and an alkynyl group having 2 to 10 carbon atoms; and a monovalent aromatic hydrocarbon group having 6 to 12 carbon atoms. The aliphatic hydrocarbon group and the aromatic hydrocarbon group may have or may not have a substituent.

Examples of the divalent organic group that $X^{C1}$ in the general formula (C-3) represents include a divalent aliphatic hydrocarbon group such as an alkylene group having 1 to 10 carbon atoms, an alkylidene group having 2 to 10 carbon atoms, and an alkenylene group having 2 to 10 carbon atoms, and an alkynylene group having 2 to 10 carbon atoms; and a divalent aromatic hydrocarbon group having 6 to 12 carbon atoms. The aliphatic hydrocarbon group and the aromatic hydrocarbon group may have or may not have a substituent.

The active ester compound (C) is preferably a compound represented by the following general formula (C-5).

(C-5)

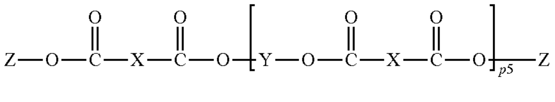

wherein X represents a residue of the polycarboxylic acid compound (c1) from which two carboxylic acids have been removed, Y represents a residue of a compound having two phenolic hydroxy groups, as described hereinabove as the compound having phenolic hydroxy groups (c2), from which two phenolic hydroxy groups have been removed, Z represents a residue of a compound having one phenolic hydroxy group, as described hereinabove as the compound having a phenolic hydroxy group (c2), from which one phenolic hydroxy group has been removed, or a residue of a compound having two phenolic hydroxy groups, from which one phenolic hydroxy group has been removed, and p5 represents a number of 0 to 10.

In the general formula (C-5), p5 is preferably a number of 0 to 5, more preferably a number of 0 to 4, even more preferably a number of 0 to 3.

The ester group equivalent of the active ester compound (C) is, though not specifically limited but from the viewpoint of heat resistance and dielectric characteristics, preferably 100 to 300 g/eq, more preferably 150 to 260 g/eq, even more preferably 200 to 230 g/eq.

The active ester compound (C) can be produced according to a known method, for example, by condensation of the polycarboxylic acid compound (c1) and the phenolic hydroxy group-having compound (c2).

The equivalent ratio of the active ester group in the active ester compound (C) to the epoxy group in the epoxy resin (B) [active ester group/epoxy group] in the photosensitive resin of the present embodiment is, from the viewpoint of heat resistance and dielectric characteristics, preferably 0.01 to 0.4, more preferably 0.1 to 0.3, even more preferably 0.15 to 0.25.

It is preferable that, in the photosensitive resin composition of the present embodiment, while the equivalent ratio of the epoxy group in the component (B) to the acidic substituent in the component (A) [epoxy group/acidic substituent] is kept to fall within a favorable range, the equivalent ratio of the active ester group in the active ester compound (C) to the epoxy group in the epoxy resin (B) therein [active ester group/epoxy group] satisfies a preferable range.

Not specifically limited, the content of the active ester compound (C) in the photosensitive resin composition of the present embodiment is, from the viewpoint of heat resistance and dielectric characteristics, preferably 1 to 15% by mass based on the total amount of the resin component in the photosensitive resin composition, more preferably 2 to 10% by mass, even more preferably 3 to 6% by mass.

<(D) Crosslinking Agent>

Preferably, the photosensitive resin composition of the present embodiment contains, as a component (D), a crosslinking agent having two or more ethylenically unsaturated groups and not having an acidic substituent [hereinafter this may be simply referred to as a crosslinking agent (D)]. The crosslinking agent (D) reacts with the ethylenically unsaturated group that the component (A) has to thereby increase the crosslinking density of the resultant cured product. Accordingly, containing a crosslinking agent (D), the photosensitive resin composition of the present embodiment tends to have more improved heat resistance and dielectric characteristics.

One alone or two or more kinds can be used either singly or as combined as the crosslinking agent (D).

The crosslinking agent (D) includes a difunctional monomer having two ethylenically unsaturated groups, and a polyfunctional monomer having three or more ethylenically unsaturated groups. The ethylenically unsaturated group that the crosslinking agent (D) has include the same as those of the ethylenically unsaturated group that the component (A) has, and preferred examples thereof are also the same.

Examples of the difunctional monomer include aliphatic di(meth)acrylates such as trimethylolpropane di(meth)acrylate, polypropylene glycol di(meth)acrylate, and polyethylene glycol di(meth)acrylate; alicyclic skeleton-having di(meth)acrylates such as tricyclodecanedimethanol diacrylate; and aromatic di(meth)acrylates such as 2,2-bis(4-

(meth)acryloxypolyethoxypolypropoxyphenyl)propane, and bisphenol A diglycidyl ether di(meth)acrylate.

Among these, from the viewpoint of securing a lower dielectric loss tangent, preferred are alicyclic skeleton-having di(meth)acrylates, and more preferred is tricyclodecanedimethanol diacrylate.

Examples of the polyfunctional monomer include trimethylolpropane-derived skeleton-having (meth)acrylate compounds such as trimethylolpropane tri(meth)acrylate; tetramethylolmethane-derived skeleton-having (meth)acrylate compounds such as tetramethylolmethane tri(meth) acrylate, and tetramethylolmethane tetra(meth)acrylate; pentaerythritol-derived skeleton-having (meth)acrylate compounds such as pentaerythritol tri(meth)acrylate, and pentaerythritol tetra(meth)acrylate; dipentaerythritol-derived skeleton-having (meth)acrylate compounds such as dipentaerythritol penta(meth)acrylate, and dipentaerythritol hexa(meth) acrylate; ditrimethylolpropane-derived skeleton-having (meth)acrylate compounds such as ditrimethylolpropane tetra(meth)acrylate; and diglycerin-derived skeleton-having (meth)acrylate compounds. Among these, from the viewpoint of improving chemical resistance after photocuring, preferred are dipentaerythritol-derived skeleton-having (meth)acrylate compounds, and more preferred is dipentaerythritol penta(meth)acrylate.

Here, "XXX-derived skeleton-having (meth)acrylate compounds" (where XXX is a compound name) mean esterified products between XXX and a (meth)acrylic acid, and the esterified products include alkyleneoxy group-modified compounds.

In the case where the photosensitive resin composition of the present embodiment contains a crosslinking agent (D), the content of the crosslinking agent (D) is, though not specifically limited but from the viewpoint of heat resistance and dielectric characteristics, preferably 5 to 70 parts by mass relative to 100 parts by mass of the component (A), more preferably 10 to 60 parts by mass, even more preferably 25 to 55 parts by mass.

<(E) Elastomer>

Preferably, the photosensitive resin composition of the present embodiment further contains an elastomer as a component (E). Containing an elastomer (E), the photosensitive resin composition of the present embodiment tends to have more improved adhesiveness to plating copper. Further, the elastomer (E) provides an effect of preventing reduction in the flexibility and the adhesiveness to plating copper caused by strain inside the cured product (internal strain) owing to curing shrinkage of the component (A).

One alone or two or more kinds can be used either singly or as combined as the elastomer (E).

The elastomer (E) may have a reactive functional group at the molecular terminal or in the molecular chain.

Examples of the reactive functional group include an acid anhydride group, an epoxy group, a hydroxy group, a carboxy group, an amino group an amide group, an isocyanate group, an acrylic group, a methacrylic group, and a vinyl group. Among these, from the viewpoint of via resolution and adhesiveness to plating copper, preferred are an acid anhydride group, an epoxy group, a hydroxy group, a carboxy group, an amino group and an amide group, more preferred are an acid anhydride group and an epoxy group, and even more preferred is an acid anhydride group.

For example, the acid anhydride group is preferably an acid anhydride group derived from phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, dimethylglutaric anhydride, diethylglutaric anhydride, succinic anhydride, methylhexahydrophthalic anhydride or methyltetrahydrophthalic anhydride, more preferably an acid anhydride group derived from maleic anhydride.

In the case where the elastomer (E) contains an acid anhydride group, from the viewpoint of via resolution and dielectric characteristics, the number of the acid anhydride groups in one molecule thereof is preferably 1 to 10, more preferably 1 to 6, even more preferably 2 to 5.

Preferably, the photosensitive resin composition of the present embodiment contains, as the elastomer (E), an elastomer having an ethylenically unsaturated group and an acidic substituent.

The acidic substituent and the ethylenically unsaturated group include the same as those of the acidic substituent and the ethylenically unsaturated group that the component (A) has. Among these, preferably, the elastomer (E) has an acid anhydride group as the acidic substituent as mentioned above, and has a 1,2-vinyl group to be mentioned below as the ethylenically unsaturated group.

Examples of the elastomer (E) include polybutadiene-based elastomers, polyester-based elastomers, styrene-based elastomers, olefin-based elastomers, urethane-based elastomers, polyamide-based elastomers, acryl-based elastomers, silicone-based elastomers, and derivatives of these elastomers. Among these, from the viewpoint of improving adhesiveness to plating copper and further from the viewpoint of improving compatibility and solubility with resin components, polybutadiene-based elastomers are preferred.

The polybutadiene-based elastomers are preferably those composed of a structure of a 1,4-trans form and a 1,4-cis form containing a 1,2-vinyl group.

As described above, the polybutadiene-based elastomer is, from the viewpoint of via resolution, preferably an acid anhydride group-having polybutadiene-based elastomer modified with an acid anhydride, and more preferably a polybutadiene-based elastomer that has an acid anhydride group derived from maleic anhydride.

Polybutadiene-based elastomers are available as commercial products, and specific examples thereof include "POLYVEST (registered trademark) MA75" and "POLYVEST (registered trademark) EP MA120" (both trade names by Evonik Corporation), and "Ricon (registered trademark) 130MA8", "Ricon (registered trademark) 131MA5" and "Ricon (registered trademark) 184MA6" (all trade names by Cray Valley Corporation).

From the viewpoint of adhesiveness to plating copper, the polybutadiene-based elastomer may also be an epoxy group-having polybutadiene [hereinafter this may be referred to as epoxydated polybutadiene].

The epoxydated polybutadiene is, from the viewpoint of adhesiveness to plating copper and flexibility, preferably an epoxydated polybutadiene represented by the following general formula (E-1).

(E-1)

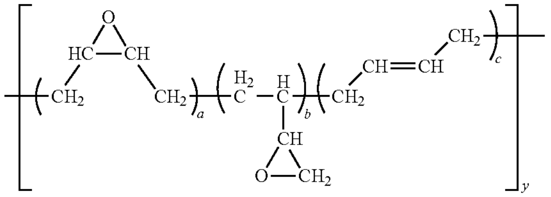

wherein a, b and c each represent a ratio of the structural units in the parenthesis, and a is 0.05 to 0.40, b is 0.02 to 0.30, and c is 0.30 to 0.80, and further these satisfy a+b+c=1.00, and (a+c) >b; y represents a number of the structural units in the bracket, and is an integer of 10 to 250.

In the general formula (E-1), the bonding order of the structural units in the bracket is inconsistent. Namely, the left-side structural unit, the central structural unit and the right-side structural unit can be put in different places, and when these structural units are represented by (a), (b), and (c), the bonding order thereof can include various modes of -[(a)-(b)-(c)]-[(a)-(b)-(c)-]-, -[(a)-(c)-(b)]-[(a)-(c)-(b)-]-, -[(b)-(a)-(c)]-[(b)-(a)-(c)-]-, -[(a)-(b)-(c)]-[(c)-(b)-(a)-]-, -[(a)-(b)-(a)]-[(c)-(b)-(c)-]-, and -[(c)-(b)-(c)]-[(b)-(a)-(a)-]-.

From the viewpoint of adhesiveness to plating copper and flexibility, a is preferably 0.10 to 0.30, b is preferably 0.10 to 0.30, c is preferably 0.40 to 0.80. Also from the same viewpoint, y is preferably an integer of 30 to 180.

Commercial products of the epoxydated polybutadiene of the general formula (E-1) where a=0.20, b=0.20, c=0.60, and y is an integer of 10 to 250 include "Epolead (registered trademark) PB3600" (by Daicel Corporation).

Examples of the polyester-based elastomer include those produced by polycondensation of a dicarboxylic acid or a derivative thereof and a diol compound or a derivative thereof.

Examples of the dicarboxylic acid include an aromatic dicarboxylic acid such as terephthalic acid, isophthalic acid and naphthalenedicarboxylic acid, and an aromatic dicarboxylic acid produced by substituting the hydrogen atom of the aromatic nucleus of the former aromatic dicarboxylic acid with a methyl group, an ethyl group or a phenyl group; an aliphatic dicarboxylic acid having 2 to 20 carbon atoms, such as adipic acid, sebacic acid, and dodecanedicarboxylic acid; and an alicyclic dicarboxylic acid such as cyclohexanedicarboxylic acid.

Examples of the diol compound include an aliphatic diol such as ethylene glycol, 1,3-propanediol, 1,4-butanediol, 1,6-hexanediol, and 1,10-decanediol; an alicyclic diol such as 1,4-cyclohexanediol; and an aromatic diol such as bisphenol A, bis(4-hydroxyphenyl)methane, bis(4-hydroxy-3-methylphenyl)propane, and resorcinol.

As the polyester-based elastomer, also preferred is a multiblock copolymer having an aromatic polyester (e.g., polybutylene terephthalate) moiety as a hard segment moiety and having an aliphatic polyester (e.g., polytetramethylene glycol) moiety as a soft segment moiety. The multiblock copolymer includes various grades depending on the difference in the kind, the ratio and the molecular weight of the hard segment and the soft segment. Specific examples thereof include "Hytrel (registered trademark)" (by DuPont Toray Corporation), "Pelprene (registered trademark)" (by Toyobo Corporation), and "Espel (registered trademark)" (by Hitachi Chemical Company, Ltd.).

In the case where the photosensitive resin composition of the present embodiment contains the elastomer (E), the content of the elastomer (E) is, though not specifically limited but from the viewpoint of heat resistance and adhesiveness to plating copper, preferably 1 to 15% by mass based on the total amount of the resin component in the photosensitive resin composition, more preferably 2 to 10% by mass, even more preferably 3 to 7% by mass.

<(F) Photopolymerization Initiator>

Preferably, the photosensitive resin composition of the present embodiment further contains a photopolymerization initiator as a component (F). Containing a photopolymerization initiator (F), the photosensitive resin composition of the present embodiment tends to have improved via resolution.

One alone or two or more kinds can be used either singly or as combined as the photopolymerization initiator (F).

The photopolymerization initiator (F) is not specifically limited so far as it can photopolymerize an ethylenic unsaturated group, and can be appropriately selected from ordinary photopolymerization initiators.

Examples of the photopolymerization initiator (F) include benzoins such as benzoin, benzoin methyl ether, and benzoin isopropyl ether; acetophenones such as acetophenone, 2,2-dimethoxy-2-phenylacetophenone, 2,2-diethoxy-2-phenylacetophenone, 1,1-dichloroacetophenone, 1-hydroxycyclohexyl phenyl ketone, 2-benzyl-2-dimethylamino-1-(4-morpholinophenyl)-1-butanone, 2-methyl-1-[4-(methylthio)phenyl]-2-morpholino-1-propanone, and N,N-dimethylaminoacetophenone; anthraquinones such as 2-methylanthraquinone, 2-ethylanthraquinone, 2-tert-butylanthraquinone, 1-chloroanthraquinone, 2-amylanthraquinone, and 2-aminoanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal, and benzyl dimethyl ketal; benzophenones such as benzophenone, methylbenzophenone, 4,4'-dichlorobenzophenone, 4,4'-bis(diethylamino)benzophenone, Michler's ketone, and 4-benzoyl-4'-methyldiphenyl sulfide; acridines such as 9-phenylacridine, and 1,7-bis(9,9'-acridinyl)heptane; acylphosphine oxides such as 2,4,6-trimethylbenzoyldiphenyl phosphine oxide; and oxime esters such as 1,2-octanethone-1-[4-(phenylthiol)phenyl]-2-(O-benzoyloxime), 1-[9-ethyl-6-(2-methylbenzoyl)-9H-carbazol-3-yl]ethenone 1-(O-acetyloxime), and 1-phenyl-1,2-propanedione-2-[O-(ethoxycarbonyl)oxime].

Among these, acetophenones and thioxanthones are preferred, and 2-methyl-1-[4-(methylthio)phenyl]-2-morpholino-1-propanone, and 2,4-diethylthioxanthone are more preferred. Acetophenones have an advantage that they hardly evaporate to give outgas; and thioxanthones have an advantage that they can cure in a visible light range. Combined use of acetophenones and thioxanthones is more preferred, and combined use of 2-methyl-1-[4-(methylthio)phenyl]-2-morpholino-1-propanone and 2,4-diethylthioxanthone is especially preferred.

In the case where the photosensitive resin composition of the present embodiment contains a photopolymerization initiator (F), the content of the photopolymerization initiator (F) is, though not specifically limited, preferably 0.01 to 20% by mass based on the total amount of the resin component in the photosensitive resin composition, more preferably 0.1 to 10% by mass, even more preferably 0.2 to 5% by mass, especially more preferably 0.3 to 2% by mass. When the content of the photopolymerization initiator (F) is not lower than the lower limit, the exposed part can be suppressed from being dissolved during development, and when the content is not more than the upper limit, heat resistance tends to improve.

<(G) Inorganic Filler>

Preferably, the photosensitive resin composition of the present invention further contains an inorganic filler as a component (G). Containing an inorganic filler (G), the photosensitive resin composition of the present embodiment tends to have a lower dielectric loss tangent and secure more excellent low thermal expansion.

One alone or two or more kinds can be used as the inorganic filler (G), either singly or as combined.

Examples of the inorganic filler (G) include silica ($SiO_2$), alumina ($Al_2O_3$), titania ($TiO_2$), tantalum oxide ($Ta_2O_5$), zirconia ($ZrO_2$), silicon nitride ($Si_3N_4$), barium titanate ($BaO{\cdot}TiO_2$), barium carbonate ($BaCO_3$), magnesium carbonate ($MgCO_3$), aluminum hydroxide ($Al(OH)_3$), magnesium hydroxide ($Mg(OH)_2$), lead titanate ($PbO{\cdot}TiO_2$), lead titanate zirconate (PZT), lanthanum lead titanium zirconate (PLZT), gallium oxide ($Ga_2O_3$), spinel ($MgO{\cdot}Al_2O_3$), mullite ($3Al_2O_3{\cdot}2SiO_2$), cordierite ($2MgO{\cdot}2Al_2O_3/5SiO_2$), talc ($3MgO{\cdot}4SiO_2{\cdot}H_2O$), aluminum titanate ($TiO_2{\cdot}Al_2O_3$), yttria-containing zirconia ($Y_2O_3{\cdot}ZrO_2$), barium silicate ($BaO{\cdot}8SiO_2$), boron nitride (BN), calcium carbonate ($CaCO_3$), barium sulfate ($BaSO_4$), calcium sulfate ($CaSO_4$), zinc oxide (ZnO), magnesium titanate ($MgO{\cdot}TiO_2$), hydrotalcite, mica, calcined kaolin, and carbon (C). Among these, silica is preferred from the viewpoint of heat resistance, low thermal expansion and dielectric characteristics.

From the viewpoint of improving the dispersibility thereof in the photosensitive resin composition, the inorganic filler (G) can be one surface-treated with a coupling agent such as a silane coupling agent. Examples of the silane coupling agent include an aminosilane coupling agent, an epoxysilane coupling agent, a phenylsilane coupling agent, an alkylsilane coupling agent, an alkenylsilane coupling agent, an alkynylsilane coupling agent, a haloalkylsilane coupling agent, a siloxane coupling agent, a hydrosilane coupling agent, a silazane coupling agent, an alkoxysilane coupling agent, a chlorosilane coupling agent, a (meth) acrylsilane coupling agent, an isocyanurate silane coupling agent, an ureidosilane coupling agent, a mercaptosilane coupling agent, a sulfide silane coupling agent, and an isocyanate silane coupling agent.

As the inorganic filler (G), an inorganic filler alone surface-treated with one kind of a coupling agent can be used, or two or more kinds of inorganic fillers each surface-treated with a different coupling agent can also be used.

In the case where a coupling agent is used, the addition method thereof may be a so-called integral blend treatment method of adding a coupling agent after an inorganic filler (G) has been added to the photosensitive resin composition, or may also be a method of previously surface-treating an inorganic filler (G) with a coupling agent in a dry mode or a wet mode before blending the filler in the composition.

The average particle diameter of the inorganic filler (G) is, from the viewpoint of via resolution, preferably 0.01 to 5 μm, more preferably 0.05 to 3 μm, even more preferably 0.1 to 1 μm, especially more preferably 0.15 to 0.7 μm.

As the inorganic filler (G), two or more kinds of inorganic fillers differing in point of the average particle diameter can be used as combined.

The average particle diameter of the inorganic filler (G) means a volume-average particle diameter, and can be determined as follows. Using a submicron particle analyzer (trade name: N5, by Beckman Coulter Inc.) and abiding by international standards ISO13321, particles dispersed in a solvent were analyzed at a refractive index of 1.38, and the particle diameter corresponding to an integrated value of 50% (volume basis) in the particle size distribution is the average particle diameter.

In the case where the photosensitive resin composition of the present embodiment contains an inorganic filler (G), the content thereof is, though not specifically limited, preferably 10 to 80% by mass based on the total amount of the solid content of the photosensitive resin composition, more preferably 20 to 65% by mass, even more preferably 30 to 55% by mass, further more preferably 40 to 50% by mass. When the content of the inorganic filler (G) is not lower than the lower limit, the photosensitive resin tends to have a lower dielectric loss tangent and a lower thermal expansion coefficient; and when the content is now more than the upper limit, the photosensitive resin tends to have more excellent adhesiveness to plating copper and via resolution.

<(H) Curing Accelerator>

Preferably, the photosensitive resin composition of the present invention further contains a curing accelerator as a component (H). When the photosensitive resin composition of the present embodiment contains a curing accelerator (H), the cured product thereof tends to have more improved heat resistance and dielectric characteristics.

One alone or two or more kinds can be used as the curing accelerator (H) either singly or as combined.

Examples of the curing accelerator (H) include imidazole and derivatives thereof such as 2-methylimidazole, 2-ethyl-4-methylimidazole, 1-benzyl-2-methylimidazole, 2-phenylimidazole, 2-phenyl-4-methyl-5-hydroxymethylimidazole, and isocyanate-masked imidazole (addition reaction product between hexamethylene diisocyanate resin and 2-ethyl-4-methylimidazole; tertiary amines such as trimethylamine, N,N-dimethyloctylamine, N-benzyldimethylamine, pyridine, N-methylmorpholine, hexa(N-methyl)melamine, 2,4,6-tris(dimethylaminophenol), tetramethylguanidine, and m-aminophenol; organic phosphines such as tributyl phosphine, triphenyl phosphine, and tris-2-cyanoethyl phosphine; phosphonium salts such as tri-n-butyl(2,5-dihydroxyphenyl)phosphonium bromide, and hexadecyltributylphosphonium chloride, quaternary ammonium salts such as benzyltrimethylammonium chloride, and phenyltributylammonium chloride; polybasic acid anhydrides of the above compounds; and diphenyliodonium tetrafluoroborate, triphenylsulfonium hexafluoroantimonate, and 2,4,6-triphenylthiopyrylium hexafluorophosphate.

Among these, from the viewpoint of attaining an excellent curing effect, imidazole and imidazole derivatives are preferred.

In the case where the photosensitive resin composition of the present embodiment contains a curing accelerator (H), the content thereof is, though not specifically limited but from the viewpoint of more improving heat resistance and dielectric characteristics, preferably 0.01 to 10% by mass based on the total amount of the resin component in the photosensitive resin composition, more preferably 0.05 to 5% by mass, even more preferably 0.1 to 1% by mass.

<(1) Epoxy Resin Curing Agent>

Preferably, the photosensitive resin composition of the present embodiment further contains an epoxy resin curing agent as a component (I). When the photosensitive resin composition of the present embodiment contains an epoxy resin curing agent (I), the cured product thereof tends to have more improved heat resistance and dielectric characteristics.

One alone or two or more kinds can be used as the epoxy resin curing agent (I) either singly or as combined.

Examples of the epoxy resin curing agent (I) include guanamines such as acetoguanamine, and benzoguanamine; polyamines such as diaminodiphenylmethane, m-phenylenediamine, m-xylylenediamine, diaminodiphenyl sulfone, dicyanediamide, urea, urea derivatives, melamine and polybasic hydrazides; organic acid salts and/or epoxy adducts of these compounds; boron trifluoride amine complexes; triazine derivatives such as ethyldiamino-S-triazine, 2,4-diamino-S-triazine, and 2,4-diamino-6-xylyl-S-triazine; and polyphenols such as polyvinylphenol, polyvinylphenol bromides, phenol novolaks, alkylphenol novolaks, and triazine ring-containing phenol-novolak resins.

In the case where the photosensitive resin composition of the present embodiment contains an epoxy resin curing agent (I), the content thereof is, though not specifically limited but from the viewpoint of more improving heat resistance and dielectric characteristics, preferably 0.01 to 10% by mass based on the total amount of the resin component in the photosensitive resin composition, more preferably 0.05 to 5% by mass, even more preferably 0.1 to 1% by mass.

<(J) Additives>

The photosensitive resin composition of the present embodiment may optionally contain, as needed, various conventional known additives, such as a pigment such as phthalocyanine blue, phthalocyanine green, iodine green, diazo yellow, crystal violet, titanium oxide, carbon black and naphthalene black; an adhesion auxiliary agent such as melamine; a sensitizer such as 4,4'-bisdiethylaminobenzophenone; a foam stabilizer such as a silicone compound; and a polymerization inhibitor, a thickener and a flame retardant.

The content of an additives (J) can be appropriately controlled depending on the individual purpose thereof, and the content of each additive is preferably 0.01 to 5% by mass based on the total amount of the resin component in the photosensitive resin composition, more preferably 0.05 to 3% by mass, even more preferably 0.1 to 1% by mass.

<Diluent>

For the photosensitive resin composition of the present embodiment, a diluent may optionally be used, as needed. As the diluent, for example, an organic solvent can be used. Examples of the organic solvent include ketones such as methyl ethyl ketone, and cyclohexanone; aromatic hydrocarbons such as toluene, xylene, and tetramethylbenzene; glycol ethers such as methyl cellosolve, butyl cellosolve, methyl carbitol, butyl carbitol, propylene glycol monomethyl ether, dipropylene glycol monoethyl ether, dipropylene glycol diethyl ether, and triethylene glycol monoethyl ether; esters such as ethyl acetate, butyl acetate, propylene glycol monomethyl ether acetate, butyl cellosolve acetate, and carbitol acetate; aliphatic hydrocarbons such as octane, and decane; and petroleum solvents such as petroleum ether, petroleum naphtha, hydrogenated petroleum naphtha, and solvent naphtha. One alone or two or more kinds of diluents can be used either singly or as combined.

The content of the diluent is can be appropriately so selected that the concentration of the total amount of the solid content in the photosensitive resin composition is preferably 30 to 90% by mass, more preferably 40 to 80% by mass, even more preferably 50 to 70% by mass. When the amount of the diluent to be used is controlled to fall within the above range, the applicability of the photosensitive resin composition improves to enable formation of higher definition patterns.

The photosensitive resin composition of the present embodiment can be produced by kneading and mixing the constituent components using a roll mill or a bead mill.

Here, the photosensitive resin composition of the present embodiment can be used as a liquid, or can also be used as a film.

In the case of using it as a liquid, the coating method with the photosensitive resin composition of the present embodiment includes, though not specifically limited, various coating methods such as a printing method, a spin coating method, a spray coating method, a jet dispense method, an ink jet method and a clip coating method. Among these, from the viewpoint of easiness in formation of a photosensitive layer, a printing method and a spin coating method are preferred.

In the case where the composition is used as a film, for example, it can be used in the form of a photosensitive resin film to be mentioned hereinunder. In such a case, by laminating the composition on a carrier film with a laminator or the like, a photosensitive layer having a desired thickness can be formed. Using the composition as a film is preferred since the production efficiency to provide multilayer printed wiring boards is high.

[Photosensitive Resin Film]

The photosensitive resin film of the present embodiment is formed of the photosensitive resin composition of the present embodiment, and is favorable for use for forming a photosensitive layer to be an interlayer insulator later.

The photosensitive resin film of the present embodiment can be formed on a carrier film.

The thickness (thickness after dried) of the photosensitive resin film (photosensitive layer) is, though not specifically limited but from the viewpoint of thinning multilayer printed wiring boards, preferably 1 to 100 μm, more preferably 3 to 50 μm, even more preferably 5 to 40 μm.

The photosensitive resin film of the present embodiment can be formed, for example, by applying the photosensitive resin composition of the present embodiment on a carrier film and drying it thereon, using a known coating device such as a comma coater, a bar coater, a kiss coater, a roll coater, a gravure coater or a die coater.

Examples of the carrier film include polyesters such as polyethylene terephthalate and polybutylene terephthalate; and polyolefins such as polypropylene and polyethylene. The thickness of the carrier film is preferably 5 to 100 μm, more preferably 10 to 60 μm, even more preferably 15 to 45 μm.

The photosensitive resin film of the present embodiment can have a protective film on the surface thereof opposite to the surface kept in contact with the carrier film. As the protective film, for example, a polymer film of polyethylene or polypropylene can be used. Also the same polymer film as the above-mentioned carrier film can be used, or a different polymer film can be used.

For drying a coating film formed by applying the photosensitive resin composition, hot air drying can be employed, or a drier using far-infrared rays or near-infrared rays is also employable. The drying temperature is preferably 60 to 150 °C, more preferably 70 to 120 °C, even more preferably 80 to 100 °C. The drying time is preferably 1 to 60 minutes, more preferably 2 to 30 minutes, even more preferably 5 to 20 minutes. The content of the remaining diluent in the photosensitive resin film after drying is, from the viewpoint of preventing diffusion of the diluent in a process of producing a multilayer printed wiring board, preferably 3% by mass or less, more preferably 2% by mass or less, even more preferably 1% by mass or less.

The photosensitive resin film of the present embodiment is excellent in via resolution, adhesiveness to plating copper and insulation reliability, and is therefore suitable for an interlayer insulator in multilayer printed wiring boards. Namely, the present invention also provides a photosensitive resin film for interlayer insulator formed of the photosensitive resin composition of the present embodiment.

[Multilayer Printed Wiring Board and Production Method Thereof]

The multilayer printed wiring board of the present embodiment includes an interlayer insulator formed of the photosensitive resin composition of the present embodiment or the photosensitive resin film of the present embodiment. The multilayer printed wiring board of the present embodiment is not specifically limited in point of the production method thereof so far as the production method includes a step of forming an interlayer insulator using the photosensitive resin composition of the present embodiment, and for example, the multilayer printed wiring board of the present embodiment can be readily produced according to the production method thereof mentioned below.

A method for producing a multilayer printed wiring board using the photosensitive resin film of the present embodiment is described appropriately with reference to FIG. 1.

A multilayer printed wiring board 100A can be produced, for example, according to a production method including the following steps (1) to (4).

Step (1): a step of laminating the photosensitive resin film of the present embodiment on one surface of both surfaces of a circuit substrate [hereinafter referred to as a lamination step (1)];

Step (2): a step of exposing and developing the photosensitive resin film laminated in the above step (1) to form an interlayer insulator having vias [hereinafter referred to as a photo-via formation step (2)];

Step (3): a step of roughening the vias and the interlayer insulator [hereinafter referred to as a roughening step (3)]; and Step (4): a step of forming a circuit pattern on the interlayer insulator [hereinafter referred to as a circuit pattern formation step (4)].

(Lamination Step (1))

The lamination step (1) is a step of laminating the photosensitive resin film (photosensitive resin film for interlayer insulator) of the present embodiment on one surface or both surfaces of a circuit substrate (a substrate 101 having a circuit pattern 102), using a vacuum laminator. Examples of the vacuum laminator include a vacuum applicator by Nichigo-Morton Co., Ltd; a vacuum pressure laminator by Meiki Co., Ltd.; a roll-type dry coater by Hitachi, Ltd.; and a vacuum laminator by Hitachi Chemical Electronics Co., Ltd.

In the case where the photosensitive resin film has a protective film, the protective film is peeled or removed, and then the resultant photosensitive resin film is laminated to a circuit substrate under pressure and heat while kept in contact with the circuit substrate.

For the lamination, for example, the photosensitive resin film and the circuit substrate can be optionally pre-heated and then laminated at a bonding temperature of 70 to 130 °C, under a bonding pressure of 0.1 to 1.0 MPa and under a reduced pressure of not more than an air pressure of 20 mmHg (26.7 hPa), but the lamination is not limited to the condition. The lamination may be a batch mode or a continuous mode as a roll.

Finally, the photosensitive resin film laminated on the circuit substrate is cooled to around room temperature to be an interlayer insulator 103. In the case where the photosensitive resin film has a carrier film, the carrier film can be peeled at that time, or can be peeled after exposure as mentioned below.

(Photo-Via Formation Step (2))

In the photo-via formation step (2), at least a part of the photosensitive resin film laminated on the circuit substrate is exposed to light and then developed. By exposure, the part irradiated with active rays is photocured to form a pattern. The exposure method is not specifically limited, and for example, employable is a method of imagewise exposing the photosensitive resin film with active rays via a negative or positive mask pattern called an art work (mask exposure method), or a method of imagewise exposing it with active rays according to a direct imaging exposure method such as an LDI (laser direct imaging) exposure method or a DLP (digital light processing) exposure method.

Any known light source can be used as the light source for the active rays. Specifically, the light source includes those that effectively emit UV rays or visible rays, such as a carbon ark lamp, a mercury vapor arc lamp, a high-pressure mercury lamp, a xenon lamp and a gas laser such as an argon laser, a solid laser such as a YAG laser, and a semiconductor laser. The exposure amount can be appropriately selected depending on the light source used and the thickness of the photosensitive layer. For example, in the case of UV irradiation from a high-pressure mercury lamp, in general, the exposure amount is preferably 10 to 1,000 mJ/cm$^2$ or so for a photosensitive layer having a thickness of 1 to 100 μm, more preferably 15 to 500 mJ/cm$^2$.

In development, the uncured part of the photosensitive layer is removed from the substrate, and an interlayer insulator of a photocured product is thereby formed on the substrate.

In the case where a carrier film exists on the photosensitive layer, the carrier film is removed and then the unexposed part is removed (by development). The development method includes wet development and dry development, and any of these is employable here, but wet development is widely used, and wet development is also employable in the present embodiment.

In the case of wet development, a liquid developer corresponding to the photosensitive resin composition is used to develop it according to a known development method. Examples of the development method include methods according to a dip system, a battle system or a spray system, or by blushing, slapping, scrapping or swing immersion. Among these, from the viewpoint of improving resolution, a spray system is preferred, and among the spray system, a high-pressure spray system is more preferred. The development can be carried out by one type method, but methods of two or more types can be combined.

The constitution of the liquid developer can be appropriately selected depending on the constitution of the photosensitive resin composition. For example, an alkaline aqueous solution, a water-based liquid developer and an organic solvent-based liquid developer are usable, and among these, an alkaline aqueous solution is preferred.

In the photo-via formation step (2), after exposure and development, the interlayer insulator can be further cured by post UV-curing with an exposure amount of 0.2 to 10 J/cm$^2$ or so (preferably 0.5 to 5 J/cm$^2$) or by post thermal curing at a temperature of 60 to 250 °C or so (preferably 120 to 200 °C), which is preferred.

As described above, an interlayer insulator having vias 104 is formed. The shape of the via is not specifically limited, and when described as the cross-sectional profile thereof, examples of the via shape include a square and a reverse trapezoid (the upper side is longer than the lower side), and when described as the shape viewed from the front (in the direction to see a via bottom), examples thereof include a circle and a square. In via formation by photolithography in the present embodiment, vias having a cross-sectional profile of a reverse trapezoid (the upper side is longer than the lower side) can be formed, and such a case is preferred since plating copper can favorably spread around the entire surface of the via wall.

The size (diameter) of the via formed in this step can be less than 40 μm, and can further be 35 μm or less or even 30 μm or less, that is, the via size can be smaller than that to be formed by laser processing. The lower limit of the via size (diameter) formed in this step is not specifically limited, and can be 15 μm or more, or 20 μm or more.

The size (diameter) of the via formed in this step is not limited to less than 40 μm, and for example, can be arbitrarily selected in a range of 15 to 300 μm.

(Roughening Step (3))

In the roughening step (3), the surfaces of the vias and the interlayer insulator are roughened with a roughening liquid. In the case where smear has formed in the photo-via formation step (2), the smear can be removed by the roughening liquid. Roughening treatment and desmearing treatment can be carried out at the same time.

Examples of the roughening liquid include a chromium/sulfate roughening liquid, an alkali permanganate roughening liquid (e.g., a sodium permanganate roughening liquid), and a sodium fluoride/chromium/sulfate roughening liquid.

By the roughening treatment, uneven anchors are formed on the surfaces of the vias and the interlayer insulator.

(Circuit Pattern Formation Step (4))

The circuit pattern formation step (4) is a step of forming a circuit pattern on the interlayer insulator after the roughening step (3).

The circuit pattern formation is, from the viewpoint of formation of micro wiring, preferably carried out by a semi-additive process. By a semi-additive process, circuit pattern formation and via conduction can be attained at the same time.

In the semi-additive process, first, a seed layer 105 is formed on the via bottom, the via wall and the entire surface of the interlayer insulator after the roughening step (3) by electroless copper plating using a palladium catalyst or the like. The seed layer is for forming a power feed layer for electrolytic copper plating, and is preferably formed in a thickness of 0.1 to 2.0 μm or so. When the thickness of the seed layer is 0.1 μm or more, connection reliability in electrolytic copper plating tends to be prevented from lowering, and when the thickness is 2.0 μm or less, the etching rate in flush-etching the seed layer between wiring need not to be large, and the wiring tends to be protected from being damaged in etching.

The electroless copper plating treatment is for deposition of a metal copper on the surfaces of the vias and the interlayer insulator by reaction of a copper ion and a reducing agent.

The electroless plating treatment and the electrolytic plating treatment are not specifically limited, and any known method is applicable thereto.

Commercial products can be used as the electroless copper plating liquid, and examples thereof include "MSK-DK" by Atotech Japan Corporation, and "THRU-CUP (registered trademark) PEA Series" by C. Uemura & Co., Ltd.

After the electroless copper plating treatment, a dry film resist is bonded by thermocompression onto the electroless copper plating with a roll laminator. The thickness of the dry film resist needs to be larger than the wiring height after electrolytic copper plating, and from this viewpoint, the thickness of the dry film resist is preferably 5 to 30 μm. As the dry film resist, usable are "Photec" series by Hitachi Chemical Company, Ltd and the like.

After thermocompression bonding of the dry resist film, for example, the dry film resist is exposed via a mask having, formed thereon, a desired wiring pattern. For the exposure, the same apparatus and the same light source as those usable in forming vias through the photosensitive resin film as above can be used. After the exposure, the dry film resist is developed with an alkaline aqueous solution to remove the unexposed part, thereby forming a resist pattern 106. After that, as needed, the development residue of the dry film resist can be removed by plasma treatment or the like.

After development, electrolytic copper plating is carried out for formation of a circuit layer 107 of copper and for via filling.

After electrolytic copper plating, the dry film resist is peeled using an alkaline aqueous solution or an amine peeling agent. After peeling of the dry film resist, the seed layer between wirings is removed (flush etching). Flush etching is carried out using an acidic solution such as sulfuric acid and hydrogen peroxide, and an oxidizing solution. After flush etching, as needed, palladium adhered to the part between the wirings is removed. Palladium removal can be carried out preferably using an acidic solution such as nitric acid and hydrochloric acid.

After peeling of the dry resist film or after the flush-etching step, preferably, post-baking treatment is carried out. By post-baking treatment, the unreacted thermally-curable component is fully thermally cured to thereby improve insulation reliability, curing characteristics and adhesiveness to plating copper. The thermally curing condition varies depending on the type of the resin composition and the like, and preferably, the curing temperature is 150 to 240 °C and the curing time is 15 to 100 minutes. By post-baking treatment, a general process of producing a multilayer printed circuit board according to a photo-via method is completed, and depending on the necessary number of interlayer insulators, the process is repeated to produce the intended substrate. With that, a solder resist layer 108 is preferably formed as an outermost layer.

In the above, a method for producing a multilayer printed circuit board by forming vias using the photosensitive resin composition of the present embodiment is described. The photosensitive resin composition of the present embodiment is excellent in pattern resolution, and therefore, for example, the photosensitive resin composition is favorable for forming cavities for holding therein chips or passive elements. Cavities can be favorably formed by designing the imaging pattern in pattern formation by exposure of a photosensitive resin film to thereby form desired cavities, for example, as in above description of the multilayer printed wiring board.

[Semiconductor Package]

The present invention also provides a semiconductor package that has a semiconductor device mounted on the multilayer printed wiring board of the present embodiment. The semiconductor package of the present embodiment can be produced by mounting a semiconductor device such as a semiconductor chip or memory at a predetermined position on the multilayer printed circuit board of the present embodiment, and sealing up the semiconductor device with a sealant resin or the like.

EXAMPLES

Hereinunder the present invention is described in detail with reference to Examples, but the present invention is not limited to these Examples. The properties of the photosensitive resin compositions obtained in Examples were evaluated according to the methods mentioned below.

[Measurement Method for Acid Value]

The acid value was calculated from the amount of the aqueous potassium hydroxide solution needed for neutralizing the resin obtained in Synthesis Example.

[1. Evaluation of Via Resolution]

A copper clad laminate substrate having a thickness of 1.0 mm (trade name "MCL-E-67" by Hitachi Chemical Company, Ltd.) was prepared. From the photosensitive resin film with a carrier film and a protective film produced in each Example, the protective film was peeled and removed, and the nonprotected photosensitive resin film was laminated on the copper clad laminate substrate, using a press vacuum laminator (trade name "MVLP-500" by Meiki Co., Ltd.) under a predetermined lamination condition (lamination pressure: 0.4 MPa, press hot plate temperature: 80 °C, evacuation time: 25 sec, lamination press time: 25 sec, pressure: 4 kPa or less) to give a laminate having a photosensitive layer.

Next, via a negative mask having a mask with, as formed thereon, a via pattern having a predetermined opening size (opening mask size: 5, 8, 10, 15, 20, 30, 40, 50, 60, 70, 80, 90, and 100 μmφ), the resultant laminate was exposed using an i-ray exposure device (trade name "UX-2240SM-XJ-01" by Ushio Inc.) at an exposure amount to provide a number of step tablet stages (ST) of 7.

Subsequently, using an aqueous 1 mass % sodium carbonate solution, this was exposed for a period of time corresponding to 4 times the shortest development time at 30 °C (the shortest time for removing the unexposed part of the photosensitive layer) under a pressure of $1.765\times10^5$ Pa to dissolve and develop the unexposed part.

Next, using a UV exposure device, this was exposed at an exposure amount of 2,000 mJ/cm$^2$, and then heated at 170 °C for 1 hour thereby producing a test piece having a cured product of a photosensitive resin composition having a via pattern of a predetermined size.

The test piece was observed with a metallographic microscope or a scanning electron microscope, and among the via patterns recognized to have openings, the opening mask size of the smallest via pattern was referred to as a smallest opening mask size. A sample whose smallest opening mask size is smaller is more excellent in via resolution.

[2. Evaluation of Dielectric Loss Tangent]

Two photosensitive resin films from which the protective film had been peeled were attached, and while still having the carrier film on both sides thereof, the resultant combined films were irradiated with a plane exposure device at 400 mJ/cm$^2$ (365 nm) and with a UV conveyor exposure device at 2 J/cm$^2$ (365 nm). This was heat-treated with a hot air circulating drier at 170 °C for 1 hour and further at 180 °C for 1 hour, and cut into a size of 7 cm×10 cm to be an evaluation sample.

The resultant evaluation sample was dried with a hot air circulating drier at 105 °C for 10 minutes, and the dielectric loss tangent thereof was measured according to a split post dielectric resonator method (SPDR method).

Synthesis Example 1

(Synthesis of Acid-Modified Vinyl Group-Containing Epoxy Resin A-1)

500 parts by mass of a bisphenol F-type epoxy resin (trade name "EXA-7376" by DIC Corporation), 72 parts by mass of acrylic acid, 0.5 parts by mass of hydroquinone and 150 parts by mass of carbitol acetate were put into a reactor, and stirred with heating at 90 °C to dissolve the mixture. Next, the resultant solution was cooled to 60 °C, then 2 parts by mass of benzyl chloride trimethylammonium was added thereto, heated up to 100 °C and reacted until the acid value of the solution could reach 1 mgKOH/g. After the reaction, 230 parts by mass of tetrahydrophthalic and 85 parts by mass of carbitol acetate were added to the solution, heated up to 80 °C and reacted for 6 hours. Subsequently, this was cooled down to room temperature, and diluted with carbitol acetate so as to have a solid concentration of 60% by mass to give an acid-modified vinyl group-containing epoxy resin A-1.

Synthesis Example 2

(Synthesis of Acid-Modified Vinyl Group-Containing Epoxy Resin A-2)

250 parts by mass of a dicyclopentadiene-type epoxy resin (trade name "XD-1000" by Nippon Kayaku Co., Ltd., an epoxy resin having a structure of the general formula (A-2)), 70 parts by mass of acrylic acid, 0.5 parts by mass of methylhydroquinone, and 120 parts by mass of carbitol acetate were put into a reactor, and stirred with heating at 90 °C to dissolve the mixture. Next, the resultant solution was cooled to 60 °C, then 2 parts by mass of triphenyl phosphine was added thereto, heated up to 100 °C and reacted until the acid value of the solution could reach 1 mgKOH/g. After the reaction, 98 parts by mass of tetrahydrophthalic anhydride and 850 parts by mass of carbitol acetate were added to the solution, heated up to 80 °C and reacted for 6 hours. Subsequently, this was cooled down to room temperature, and the solvent was evaporated away so as to have a solid concentration of 65% by mass to give an acid-modified vinyl group-containing epoxy resin A-2.

Preparation of Photosensitive Resin Composition

Examples 1 to 5, Reference Example 1, Comparative Example 1

(1) Production of Photosensitive Resin Composition

Components were blended according to the blending formulation shown in Table 1 and Table 2 (the unit of the numerical value in the Tables is part by mass, and for solutions, the unit indicates a solid content-equivalent amount), and kneaded with a three-roll mill. Subsequently, methyl ethyl ketone was added to the resultant mixture so as to have a solid concentration of 65% by mass to give a photosensitive resin composition.

(2) Production of Photosensitive Resin Film

A polyethylene terephthalate film having a thickness of 16 μm (trade name "G2-16" by Teijin Limited) was used as a carrier film. Onto the carrier film, the photosensitive resin composition prepared in Example was applied so as to have a dry film thickness of 25 μm, and dried at 75 °C for 30 minutes with a hot air convection drier to form a photosensitive resin film (photosensitive layer). Subsequently, onto the surface opposite to the side in contact with the carrier film of the photosensitive resin film (photosensitive layer), a polyethylene film (trade name "NF-15" by Tamapoly Co., Ltd.) as a protective film was stuck to give a photosensitive resin film with a carrier film and a protective film stuck thereto.

The thus-produced photosensitive resin film was evaluated according to the above-mentioned methods. The results are shown in Table 1 and Table 2.

TABLE 1

| | | | Unit | Example 1 | Example 2 | Comparative Example 1 |
|---|---|---|---|---|---|---|
| Photosensitive Resin Composition | (A) Photopolymerizable Compound | Acid-modified vinyl group-containing epoxy resin A-1 | Part by mass | 31.1 | 31.1 | 31.1 |
| | (B) Epoxy Resin | Bisphenol F-type epoxy resin | Part by mass | 11.6 | 11.6 | 11.6 |
| | | Naphthol novolak-type epoxy resin | Part by mass | 5.3 | 5.3 | 5.3 |
| | (C) Active Ester Compound | Active Ester Compound C-1 | Part by mass | 3.0 | 6.0 | |
| | (D) Crosslinking Agent | Dipentaerythritol hexaacrylate | Part by mass | 9.7 | 9.7 | 9.7 |
| | (E) Elastomer | Polyester Elastomer | Part by mass | 1.2 | 1.2 | 1.2 |
| | | Epoxydated polybutadiene | Part by mass | 2.3 | 2.3 | 2.3 |
| | (F) Photopolymerization Initiator | Photopolymerization initiator 1 | Part by mass | 0.05 | 0.05 | 0.05 |
| | | Photopolymerization initiator 2 | Part by mass | 0.66 | 0.66 | 0.66 |
| | (G) Inorganic Filler | Silica 1 | Part by mass | 31.4 | 31.4 | 31.4 |
| | | Silica 2 | Part by mass | 5.3 | 5.3 | 5.3 |
| | (I) Epoxy Resin Curing Agent | Triazine ring-containing phenol novolak resin | Part by mass | 0.38 | 0.38 | 0.38 |
| | (J) Additive | 4,4'-bisdiethylaminobenzophenone | Part by mass | 0.07 | 0.07 | 0.07 |
| | | 1,3,5-triazine-2,4,6-triamine | Part by mass | 0.39 | 0.39 | 0.39 |
| | | Silicone-type foam stabilizer | Part by mass | 0.16 | 0.16 | 0.16 |
| | | Pigment | Part by mass | 0.33 | 0.33 | 0.33 |
| | (G) Content of Inorganic Filler (based on total solid content in photosensitive resin composition) | | % by mass | 36 | 35 | 37 |
| Evaluation Result | (1) Smallest Opening Mask Size | | μm | 40 | 40 | 40 |
| | (2) Dielectric Loss Tangent | | — | 0.0183 | 0.0177 | 0.0200 |

TABLE 2

| | | | Unit | Example 3 | Example 4 | Example 5 | Reference Example 1 |
|---|---|---|---|---|---|---|---|
| Photosensitive Resin Compound | (A) Photopolymerizable Composition | Acid-modified vinyl group-containing epoxy resin A-2 | Part by mass | 31.1 | 31.1 | 31.1 | 31.1 |
| | (B) Epoxy Resin | Bisphenol F-type epoxy resin | Part by mass | 8.1 | 8.1 | 8.1 | 8.1 |
| | | Biphenyl aralkyl-type epoxy resin | Part by mass | 3.7 | 3.7 | 3.7 | 3.7 |
| | (C) Active Ester Compound | Active Ester Compound C-2 | Part by mass | 2.3 | | | |
| | | Active Ester Compound C-3 | Part by mass | | 2.4 | | |
| | | Active Ester Compound C-4 | Part by mass | | | 2.3 | |
| | (D) Crosslinking Agent | Tricyclodecanedimethanol diacrylate | Part by mass | 15.2 | 15.2 | 15.2 | 15.2 |
| | (E) Elastomer | Maleic anhydride-modified polybutadiene | Part by mass | 3.5 | 3.5 | 3.5 | 3.5 |
| | (F) Photopolymerization Initiator | Photopolymerization initiator 1 | Part by mass | 0.05 | 0.05 | 0.05 | 0.05 |
| | | Photopolymerization initiator 2 | Part by mass | 0.66 | 0.66 | 0.66 | 0.66 |
| | (G) Inorganic Filler | Silica 1 | Part by mass | 56.1 | 58.4 | 58.3 | 55.8 |
| | | Silica 2 | Part by mass | 9.4 | 9.8 | 9.8 | 9.4 |
| | (H) Curing Accelerator | Isocyanate-masked imidazole | Part by mass | 0.43 | 0.43 | 0.43 | |
| | (I) Epoxy Resin Curing Agent | Triazine ring-containing phenol novolak resin | Part by mass | 0.25 | 0.25 | 0.25 | 0.25 |
| | (J) Additive | 4,4'-bisdiethylaminobenzophenone | Part by mass | 0.07 | 0.07 | 0.07 | 0.07 |
| | | Silicone-type foam stabilizer | Part by mass | 0.16 | 0.16 | 0.16 | 0.16 |
| | | Pigment | Part by mass | 0.33 | 0.33 | 0.33 | 0.33 |
| | (G) Content of Inorganic Filler (based on total solid content in photosensitive resin composition) | | % by mass | 50 | 51 | 51 | 51 |
| Evaluation Result | (1) Smallest Opening Mask Size | | μm | 40 | 40 | 40 | 40 |
| | (2) Dielectric Loss Tangent | | — | 0.0101 | 0.0098 | 0.0092 | 0.0104 |

The components used in Table 1 and Table 2 are as follows.

[(A) Photopolymerizable Compound]

Acid-modified vinyl group-containing epoxy resin A-1: acid-modified vinyl group-containing epoxy resin A-1 prepared in Synthesis Example 1.

Acid-modified vinyl group-containing epoxy resin A-2: acid-modified vinyl group-containing epoxy resin A-2 prepared in Synthesis Example 2.

[(B) Epoxy Resin]

Bisphenol F-type epoxy resin (bisphenol-type epoxy resin, epoxy equivalent 192 g/eq).

Naphthol novolak-type epoxy resin (trade name "NC-7000-L" by Nippon Kayaku Co., Ltd., epoxy equivalent 231 g/eq).

Biphenyl aralkyl-type epoxy resin (trade name "NC-3000-L" by Nippon Kayaku Co., Ltd., epoxy equivalent 272 g/eq).

[(C) Active Ester Compound]

Active ester compound C-1: active ester compound having a dicyclopentadiene-type diphenol structure (trade name "HPC-8000-65T" by DIC Corporation, ester group equivalent 223 g/eq Active ester compound C-2: polyarylate resin (trade name "V-575" by Unitika Ltd., ester group equivalent: 210 g/eq, active ester group-having polyarylate resin produced from a dicarboxybenzene and a bisphenol.

Active ester compound C-3: polyarylate resin (trade name "W-575" by Unitika Ltd., ester group equivalent: 220 g/eq, active ester group-having polyarylate resin produced from a dicarboxybenzene and a bisphenol.

Active ester compound C-4: trade name "EXB-8" by DIC Corporation.

[(D) Crosslinking Agent]

Dipentaerythritol hexaacrylate

Tricyclodecanedimethanol diacrylate

[(E) Elastomer]

Polyester elastomer (trade name "SP1108" by Hitachi Chemical Company Ltd.

Epoxydated polybutadiene (trade name "PB3600" by Daicel Corporation)

Maleic anhydride-modified polybutadiene (trade name "Ricon (registered trademark) 130MA8" by Cray Valley Corporation, number of maleic anhydride modifying groups; 2, 1,4-trans form+1,4-cis form: 72%).

[(F) Photopolymerization Initiator]

Photopolymerization initiator 1: 2-methyl-[4-(methylthio)phenyl]morpholino-1-propanone (acetophenone compound).

Photopolymerization initiator 2: 2,4-diethylthioxanthone (thioxanthone compound).

[(G) Inorganic Filler]

Silica 1: spherical molten silica having an average particle diameter of 0.5 μm (treated with coupling agent).

Silica 2: spherical molten silica having an average particle diameter of 0.18 μm (treated with coupling agent).

[(H) Curing Accelerator]

Isocyanate-masked imidazole (trade name "G8009L" by DKS Co., Ltd.)

[(I) Epoxy Resin Curing Agent]

Triazine ring-containing phenol novolak resin (trade name "LA7052" by DIC Corporation)

[(J) Additives]

4,4'-Bisdiethylaminobenzophenone 1,3,5-Triazine-2,4,6-triamine

Silicone foam stabilizer

Pigment

From Table 1, it is known that the photosensitive resin compositions of Examples 1 and 2 of the present embodiment can reduce the dielectric loss tangent while maintaining good resolution (smallest opening diameter), as compared with the photosensitive resin composition of Comparative Example 1 not containing the component (C).

Further, the photosensitive resin compositions of Reference Example 1 and Examples 3 to 5 in Table 2 all have a low dielectric loss tangent, and it is known that, among them, the photosensitive resin compositions of Examples 3 to 5 attained a remarkably low dielectric loss tangent.

REFERENCE SIGNS LIST

100A Multilayer Printed Circuit Board
101 Substrate
102 Circuit Pattern
103 Interlayer Insulator
104 Via (via hole)
105 Seed Layer
106 Resist Pattern
107 Circuit Layer of Copper
108 Solder Resist Layer

The invention claimed is:

1. A photosensitive resin composition comprising:

(A) a photopolymerizable compound having an ethylenically unsaturated group and an acidic substituent, (B) an epoxy resin comprising a bisphenol-type epoxy resin and an aralkyl-type epoxy resin, wherein the content ratio of the bisphenol-type epoxy resin to the aralkyl-type epoxy resin [bisphenol-type epoxy resin/aralkyl-type epoxy resin] is from 1.0 to 4.0, (C) an active ester compound, and (E) an elastomer having an ethylenically unsaturated group and an acid anhydride group, wherein a content of (C) the active ester compound is 1 to 10% by mass based on a total amount of the resin components in the photosensitive resin composition.

2. The photosensitive resin composition according to claim 1, wherein the (A) photopolymerizable compound having an ethylenically unsaturated group and an acidic substituent comprises an alicyclic structure represented by the following general formula (A-1):

(A-1)

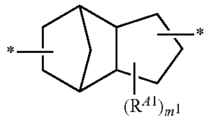

wherein $R^{A1}$ represents an alkyl group having 1 to 12 carbon atoms, and may be at any position in the alicyclic structure, $m^1$ represents an integer of 0 to 6, and * is a bonding position to the other structure.

3. The photosensitive resin composition according to claim 1, wherein the acid value of the (A) photopolymerizable compound having an ethylenically unsaturated group and an acidic substituent is 20 to 200 mgKOH/g.

4. The photosensitive resin composition according to claim 1, wherein the (C) active ester compound is a compound having two or more active ester groups in one molecule, and the two or more active ester groups are active ester groups produced from a polycarboxylic acid compound and a phenolic hydroxy group-having compound.

5. The photosensitive resin composition according to claim 1, wherein the equivalent ratio of the epoxy group of the (B) epoxy resin to the acidic substituent of the (A) photopolymerizable compound having an ethylenically unsaturated group and an acidic substituent [epoxy group/acidic substituent] is 0.5 to 6.0, and the equivalent ratio of the active ester group of the (C) active ester compound to the epoxy group of the (B) epoxy resin [active ester group/epoxy group] is 0.01 to 0.4.

6. The photosensitive resin composition according to claim 1, further comprising (D) a crosslinking agent having two or more ethylenically unsaturated groups and not having an acidic substituent.

7. The photosensitive resin composition according to claim 1, further comprising (F) a photopolymerization initiator.

8. The photosensitive resin composition according to claim 1, further comprising (G) an inorganic filler in an amount of 10 to 80% by mass based on the total solid content of the photosensitive resin composition.

9. The photosensitive resin composition according to claim 1, further comprising (H) a curing accelerator.

10. The photosensitive resin composition according to claim 1, which is used for formation of one or more selected from the group consisting of a photo-via and an interlayer insulator.

11. A photosensitive resin film formed of the photosensitive resin composition of claim 1.

12. A multilayer printed wiring board comprising an interlayer insulator comprising a cured product of the photosensitive resin composition of claim 1.

13. A semiconductor package wherein a semiconductor device is mounted on the multilayer printed wiring board of claim 12.

14. A method for producing a multilayer printed wiring board comprising the following steps (1) to (4):

Step (1): a step of laminating the photosensitive resin film of claim 11 on one surface or both surfaces of a circuit substrate;

Step (2): a step of exposing and developing the photosensitive resin film laminated in the above step (1) to form an interlayer insulator having vias;

Step (3): a step of roughening the vias and the interlayer insulator; and

Step (4): a step of forming a circuit pattern on the interlayer insulator.

15. The photosensitive resin composition according to claim 1, wherein the (E) elastomer has an ethylenically unsaturated group and an acid anhydride group derived from maleic anhydride.

16. The photosensitive resin composition according to claim 1, wherein the (E) elastomer comprises a polybutadiene-based elastomer that has an acid anhydride group derived from maleic anhydride.

17. The photosensitive resin composition according to claim 1, wherein the content of (C) the active ester compound is 2 to 10% by mass based on a total amount of the resin components in the photosensitive resin composition.

18. The photosensitive resin composition according to claim 6, wherein (D) the crosslinking agent includes an alicyclic skeleton-having di(meth)acrylates.

* * * * *